United States Patent [19]

Bloker et al.

[11] Patent Number: 4,870,304

[45] Date of Patent: Sep. 26, 1989

[54] FAST EPROM PROGRAMMABLE LOGIC ARRAY CELL

[75] Inventors: Raymond Bloker, San Jose; Robert Burd, Milpitas; Bruce Frederick, Los Gatos, all of Calif.

[73] Assignee: Cypress Semiconductor Corporation, San Jose, Calif.

[21] Appl. No.: 129,990

[22] Filed: Dec. 8, 1987

[51] Int. Cl.[4] .......................................... H03K 19/177
[52] U.S. Cl. .................................. 307/468; 307/450; 307/465
[58] Field of Search ............... 307/443, 448, 450, 465, 307/468–469; 364/716; 365/104, 185, 187

[56] References Cited

U.S. PATENT DOCUMENTS

| | | | |
|---|---|---|---|
| 4,467,451 | 8/1984 | Moyer | 365/185 X |
| 4,495,427 | 1/1985 | Cartwright, Jr. | 307/450 X |
| 4,565,932 | 1/1986 | Kuo et al. | 365/185 X |
| 4,617,649 | 10/1986 | Kyomasu et al. | 365/104 X |
| 4,663,740 | 5/1987 | Ebel | 365/185 |
| 4,715,014 | 12/1987 | Tuvell et al. | 365/187 X |
| 4,725,980 | 2/1988 | Wakimoto et al. | 365/185 |
| 4,727,515 | 2/1988 | Hsu | 365/185 |
| 4,769,788 | 9/1988 | Poeppelman et al. | 365/185 |

Primary Examiner—David Hudspeth
Attorney, Agent, or Firm—Blakely, Sokoloff, Taylor & Zafman

[57] ABSTRACT

A fast EPROM programmable logic array cell utilizing a MOSFET to drive the output of the EPROM array cell which is coupled to a product term. The MOSFET has a current path which is coupled to the product term to modulate the binary status of the product term under control of an MOS EPROM field effect transistor which is coupled to the MOSFET. The MOSFET is other than an EPROM field effect transistor.

17 Claims, 8 Drawing Sheets

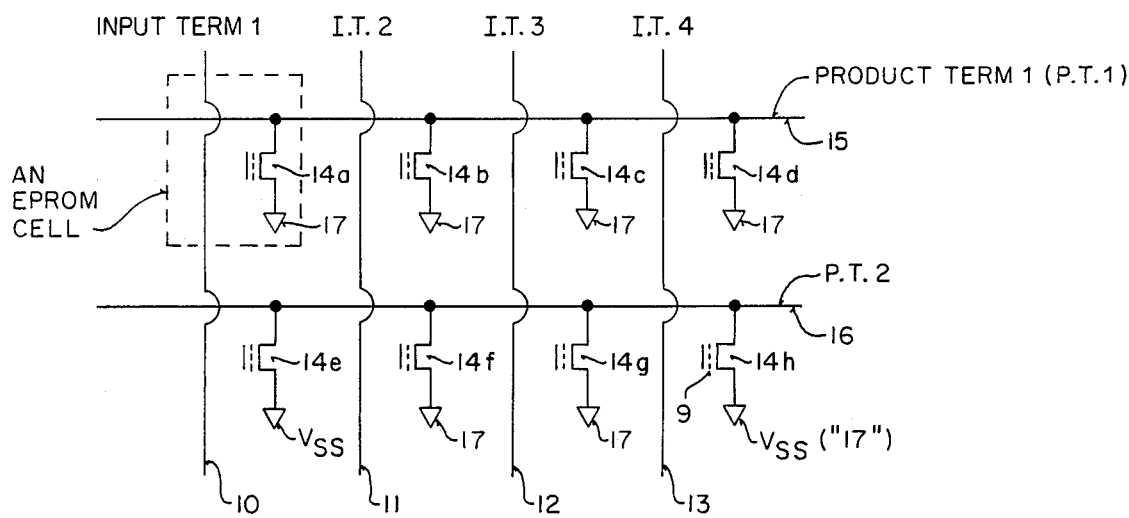
FIG_1A (PRIOR ART) PLA
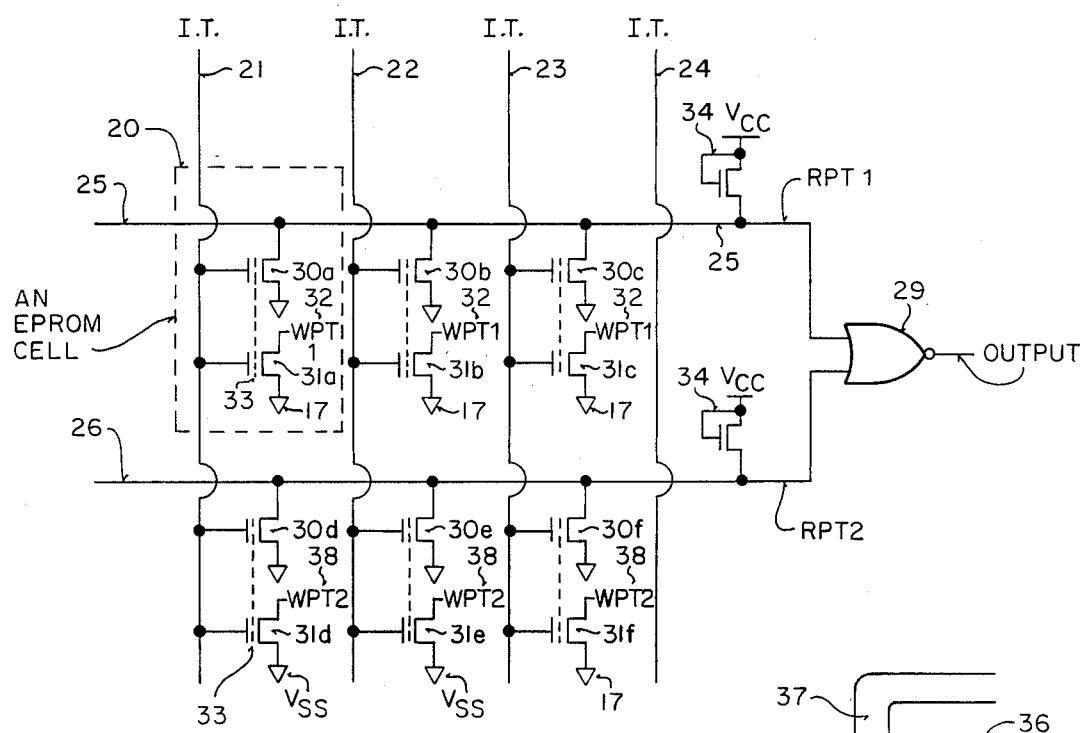
FIG_1B (PRIOR ART) PLA
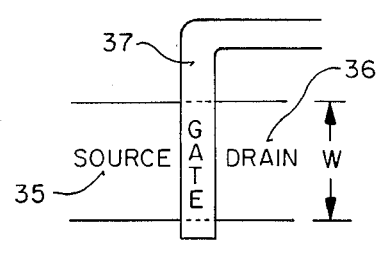
FIG_1C

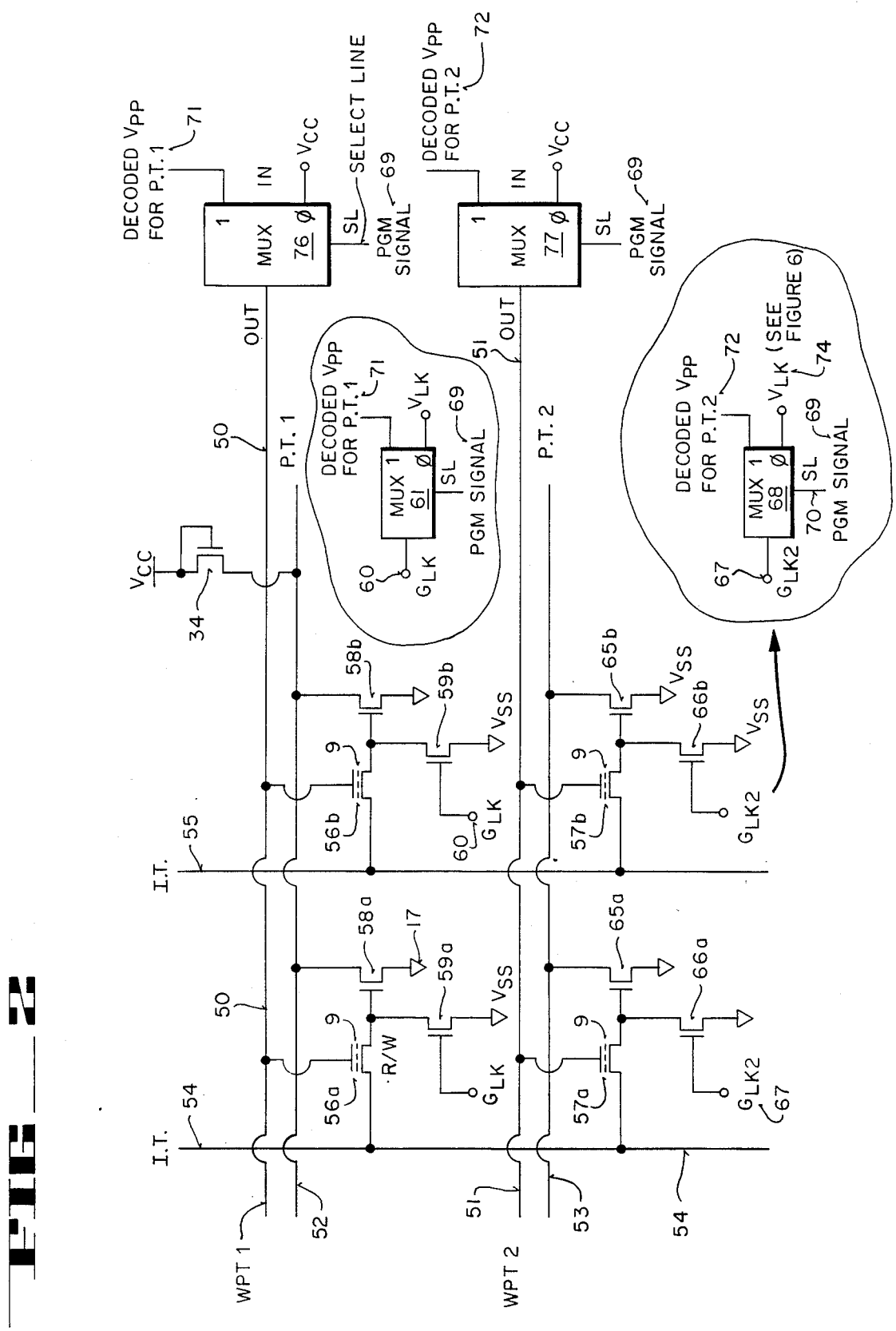
FIG._2

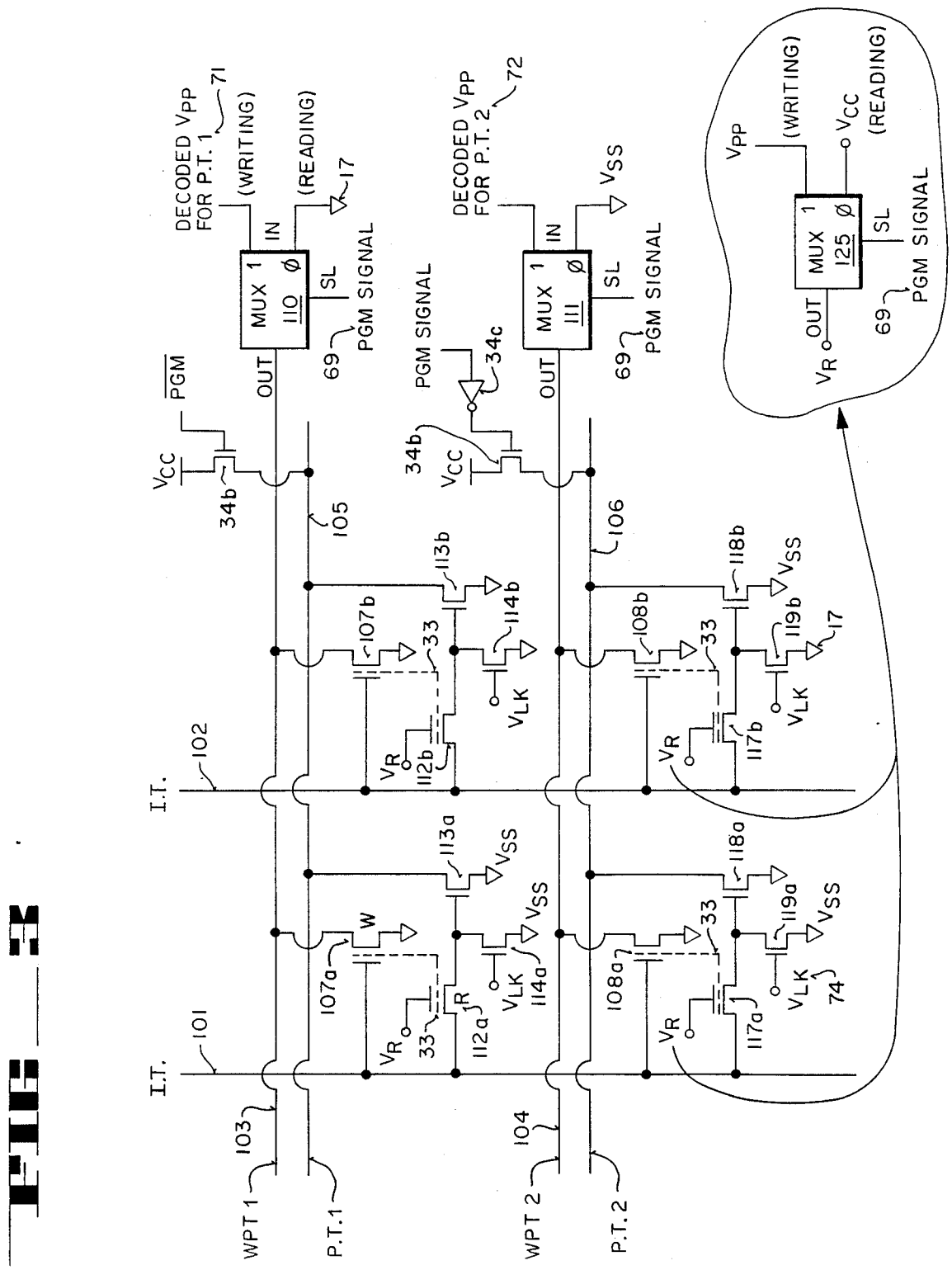
FIG_3

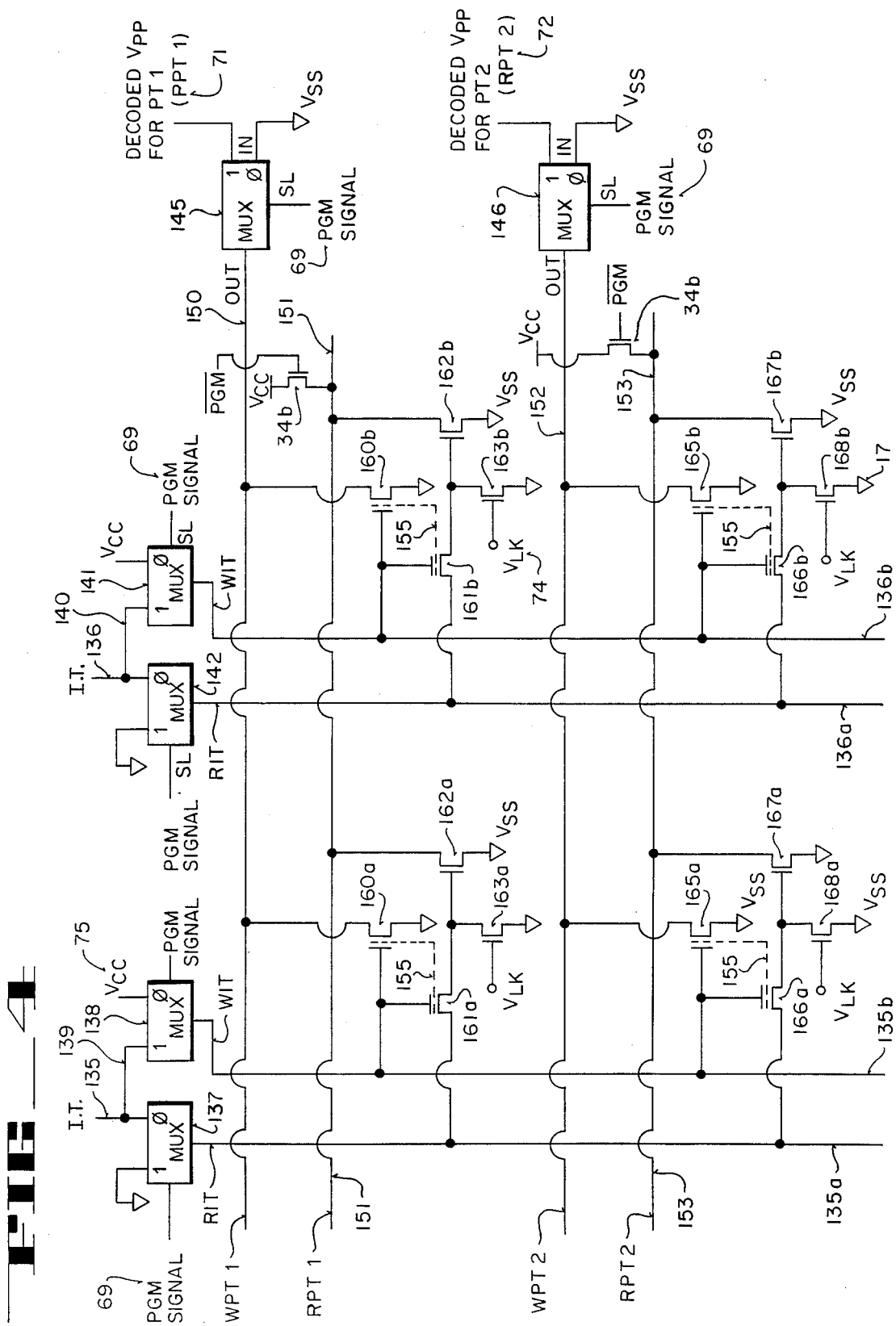
FIG_4

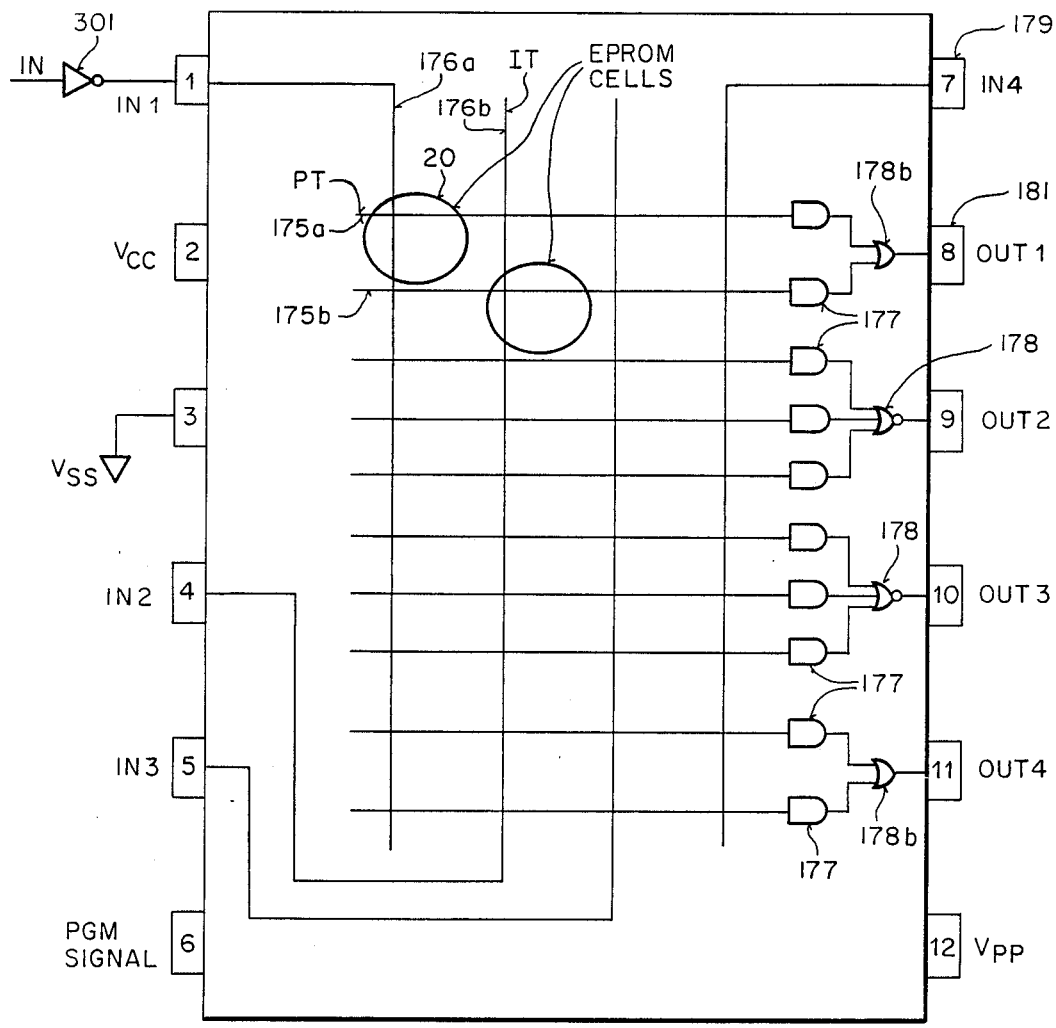
FIG_5  PLA CHIP

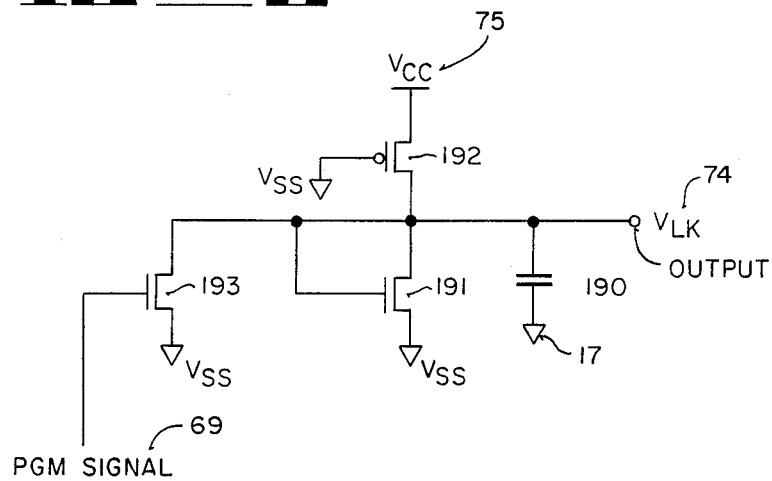
FIG__6
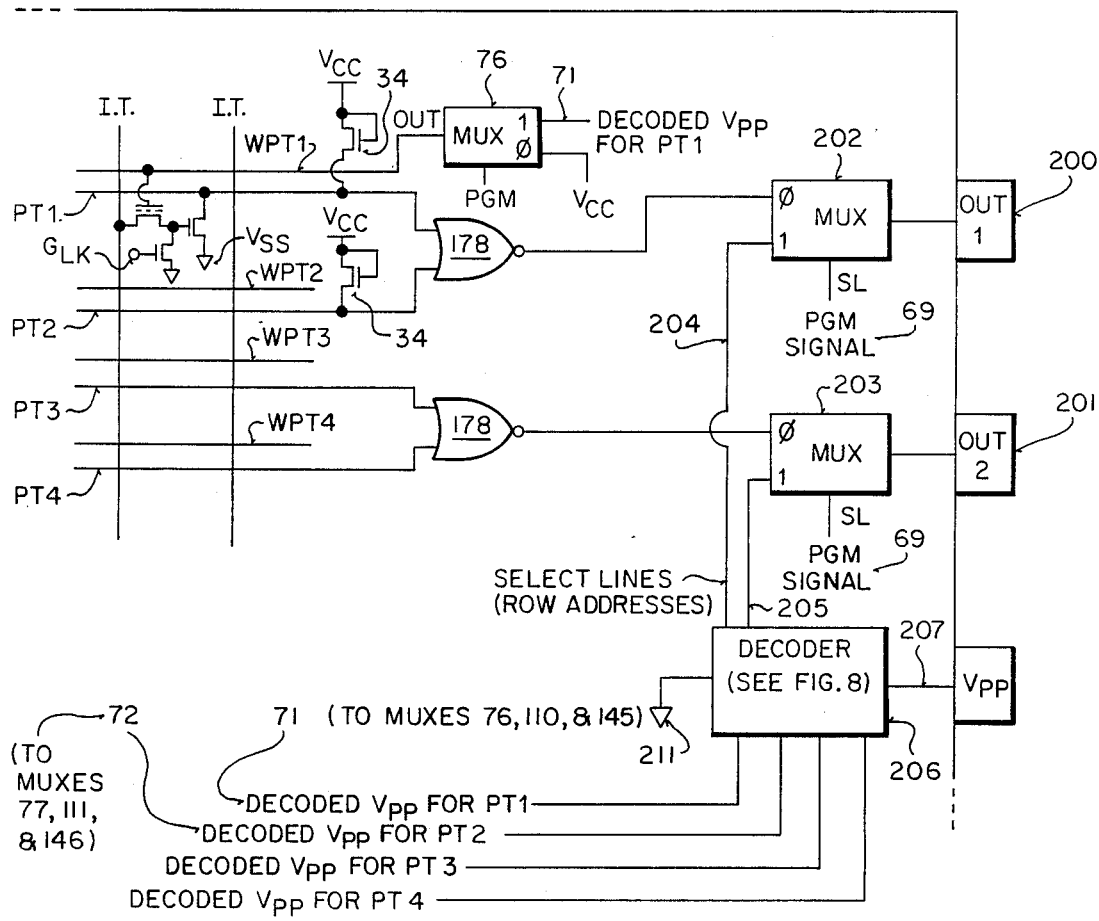
FIG__7

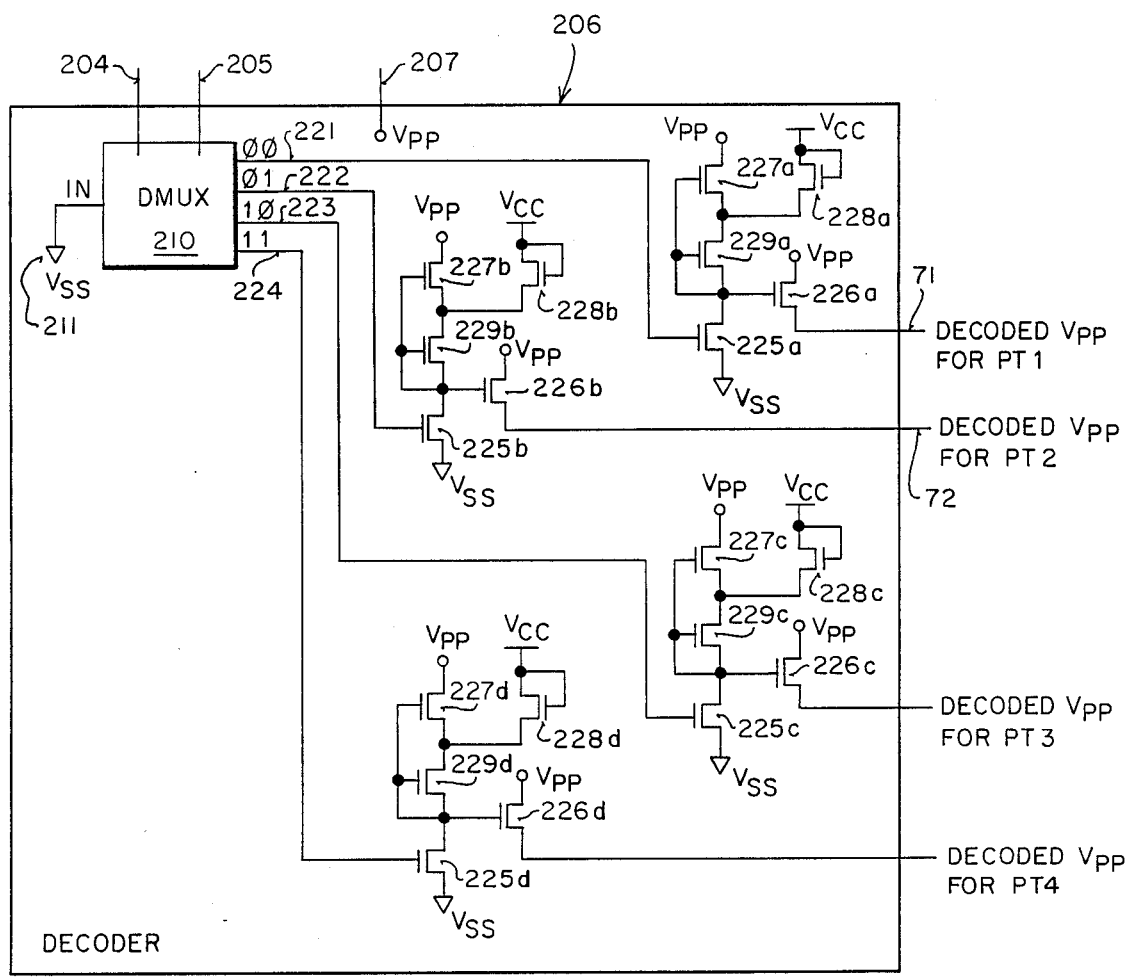
FIG_8
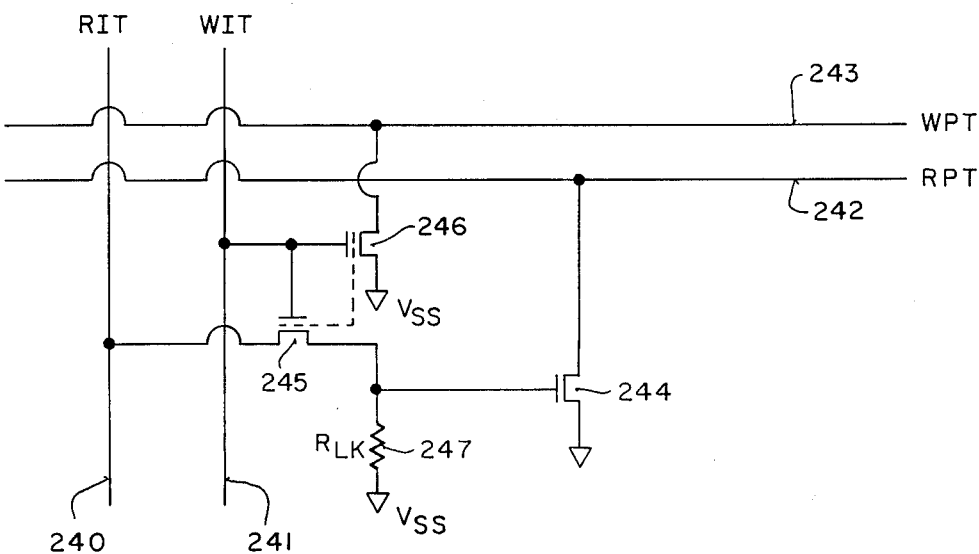
FIG_9

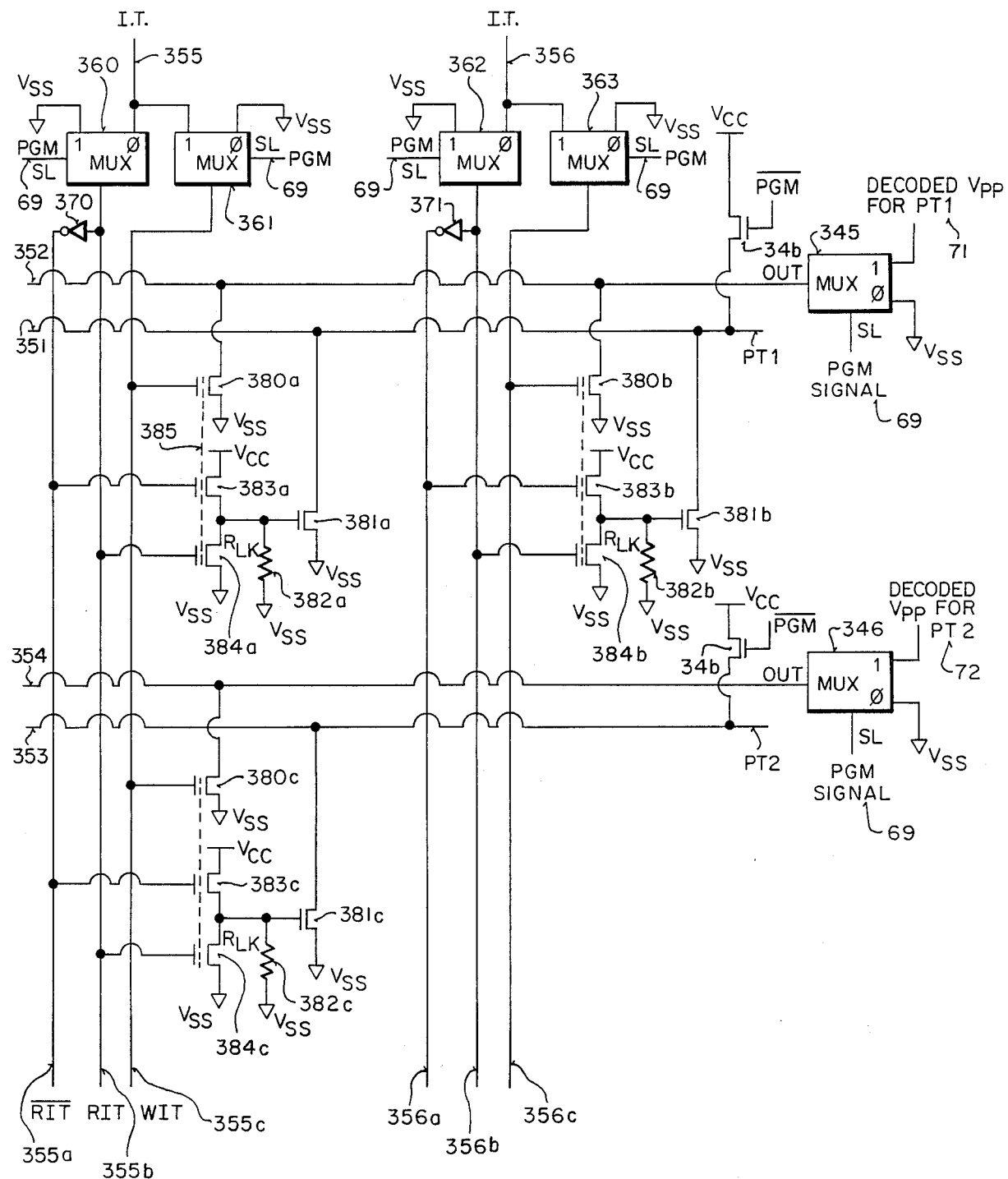
FIG_10

4,870,304

FAST EPROM PROGRAMMABLE LOGIC ARRAY CELL

BACKGROUND OF THE INVENTION

This invention relates to programmable logic arrays which utilize an MOS EPROM field effect transistor within the storage cell (EPROM cell) at each "intersection" of the array.

FIG. 1A shows a typical prior art implementation of a programmable logic array (PLA) which uses an MOS (metal-oxide-semiconductor) EPROM (Electrically Programmable Read Only Memory) field effect transistor in each storage cell. FIG. 1A shows the well known grid formed by a plurality of input terms, shown vertically, which "intersect" with a plurality of product terms (there is, of course, no literal electrical connection between input term and product term at the intersection). At the "intersections" of an input term and a product term, there is a programmable storage cell which may be referred to as an EPROM cell since the prior art cell uses an EPROM transistor to store and retrieve data. Thus, at the "intersection" of product term 15 (P.T.1) and input term 10 (I.T.1) there is an EPROM cell which contains an EPROM device 14a. It can be seen from FIG. 1A that the source of each EPROM transistor is coupled to Vss (labelled "17"), which is typically ground. The drain of each of these EPROMs, such as EPROMs 14a and 14b, is coupled to a product term; thus, EPROM 14b has its drain coupled to product term 15 which is also referred to as product term (P.T.1). Each EPROM in FIG. 1A, such as EPROM 14h, includes a floating gate 9 which stores binary data having two possible states and further includes a gate. The operation and structure of this prior art programmable logic array is well known in the art. See, for example, U.S. Pat. Nos. 4,124,899; 4,609,986 and 4,617,479 and the references cited in those patents; also see pages 4-1 through 4-61 of *CMOS Data Book* of Cypress Semiconductor Corporation (3901 North First Street, San Jose, California, 95134); and *Programmable Logic Handbook*, 1987, of Intel Corportation (3065 Bowers Avenue, Santa Clara, California, 95051; order no. 296083-002).

FIG. 1B shows another embodiment of a PLA in the prior art where each EPROM cell, such as EPROM cell 20, includes two EPROM MOS field effect transistors, one of which is employed to write to the EPROM cell by charging the floating gate 33 and the other of which is employed to read the state of the floating gate 33. In each EPROM cell, the floating gate 33 is common to both the write transistor, each as EPROM 31a, and the read EPROM transistor such as 30a. As is well known in the art, each product term produces a logical AND or NOR result. The embodiment shown in FIG. 5 shows the "AND" function (result) represented by AND gates 177. Each AND gate represents the logical AND result (only if all inputs are logically inverted before applying the inputs to the input pins shown in FIG. 5; otherwise, each product term actually performs a NOR logical function) which is produced by each product term. Some product terms are coupled to a NOR gate, such as NOR gate 178, which produces the well known (inverted) sum of products. Other product terms are coupled to an OR gate, such as OR gate 178b which produces the sum of products. An inverter 301 is shown coupled to Input 1 pin (IN1) of the PLA chip in FIG. 5, such an inverter will logically invert the input to the inverter, thereby producing the logically inverted input at the input 1 pin (IN1) of FIG. 5. It is understood that a PLA chip, such as that shown in FIG. 5, will normally include a plurality of product terms each of which represents a logical AND gate (if all inputs are logically inverted), such as AND gate 177, and each product term is coupled to an OR 178b gate or a NOR gate, such as NOR gate 178 or 29. It is also appreciated that many variations in the logical functions in the array and in the outputs and inputs may be used, as is well known in the art. For example, input buffers and output buffers may be employed along with flip-flops, multiplexers and other controls in the output section of a PLA, which controls are often referred to as an output macrocell (see, e.g., pages 4-39 of *CMOS Data Book*).

Programming of a PLA, such as that shown in FIG. 1B, is accomplished in the well known manner of applying selectively a "super voltage" (e.g. 10-25 V, which is referred to as the programming voltage $V_{pp}$) to a particular input term and at the same time applying a super voltage to a write product term for a particular row (product term). For example, to program the EPROM cell 20 shown in FIG. 1B, a super voltage is applied to input term 21 while, at the same time, a super voltage is also applied to the write product term 32 (WPT1) which is bussed parallel with the read product term 25. When the super voltage is applied to input term 21 and to WPT1 (write product term 32) it will cause the super voltage to be applied to the gate of the EPROM 31a while, on WPT1, the super voltage is applied to the drain of EPROM 31a causing that EPROM MOS transistor to conduct significant current (through the current path of that EPROM between its source and drain) such that hot electrons, as is well known in the art, are driven from the channel region of EPROM 31a into the floating gate 33 which is contiguous with the floating gate of EPROM 30a. These hot electrons become trapped on the floating gate 33 of the EPROM 31a and 30a; these trapped electrons on the floating gate program the read EPROM 30a such that, under normal operating conditions no appreciable current will flow through EPROM 30a. When the floating gate of an EPROM becomes charged, that EPROM is referred to as a programmed EPROM and the cell containing that EPROM has also been programmed.

As a consequence of programming, the binary status of the read product term 25 will not be affected (e.g. pulled down to ground) by EPROM 30a once it is programmed by storing electrons on the floating gate 33. If an EPROM cell is left unprogrammed (the state when the floating gate of the EPROM is left uncharged) then it is possible for appreciable current to flow through the read EPROM transistor, which current will pull down the read product term 25 to ground (even if all other EPROMs along that product term are not conducting). If no read EPROMs along the row formed by read product term 25 are on, then the read product term 25 will be pulled substantially high (e.g. "binary 1") by the pull-up device 34 which may be an N-channel MOS field effect transistor having its gate and drain coupled to a circuit supply voltage, Vcc, which is often 5 V in the typical MOS chip. The source of pull-up device 34 is coupled to the read product term, as shown in FIG. 1B. Other embodiments of the pull-up device 34 which may be implemented by those skilled in the art include N-channel depletion devices, resistors, and P-channel devices.

It is understood that the selective programming of each of these EPROM cells enables a specific logic function to be implemented by the user as is well known in the art. Each product term represents a "product" (the result of an AND gate) which is then summed with other "products" from other product terms through the OR 178b or NOR 178 gates. It will be appreciated that any one of the read EPROM devices which are coupled to read product term 25 (e.g. EPROMs 30a, 30b or 30c) should be capable of pulling down the read product term 25 to ground even if the other read EPROM transistors along read product term 25 are off. The architecture of the PLAs shown in FIG. 1B and FIG. 5 uses a field programmable "AND" (or NOR) array which is non-programmably coupled to specified OR or NOR gates; that is, outputs from a subgroup of product terms are nonprogrammably connected as inputs to individual, specified OR (or NOR) gates to produce the "sum of the products". This architecture may be advantageously used with the present invention.

The prior art EPROM cells in programmable logic arrays use the EPROM transistors to directly drive the cell output which is coupled to the product term. This output is usually a very high capacitance node since it connects to the product term which is connected to many other EPROM cells as well as sensing circuits which amplify the signal. The naturally high impedance of an EPROM MOS transistor combined with the large capacitance on the cell output results in a long switching time on the product term node. This long switching time results in slower performance integrated circuits which utilize programmable logic arrays. It is an object of the present invention to provide an improved EPROM storage cell which provides much faster switching times by using a non-EPROM MOS field effect transistor having a low impedance to directly drive the cell output—i.e. to directly drive (modulate) the product term. The low impedance MOS transistor is turned on based on the status of the input term as well as the program state of an EPROM transistor which acts to modulate the non-EPROM MOS field effect transistor which drives the cell output.

SUMMARY OF THE INVENTION

An improved fast EPROM programmable logic array cell is disclosed. The EPROM PLA cell of the invention is faster than prior art storage cells used in PLAs. Several embodiments are disclosed, including embodiments using two EPROM MOS transistors per EPROM cell in the PLA and another embodiment utilizing a single EPROM MOS transistor for each EPROM cell in the PLA. The EPROM PLA cell of the invention may be implemented in well known MOS planar processing technology.

Generally, the invention uses an EPROM MOS field effect transistor means as a content element within each EPROM cell to control a lower impedance MOS (metal oxide semiconductor) field effect transistor means which is coupled to and drives the product term. The MOS EPROM transistor means includes a floating gate for storing binary data and has a current path formed between (and including) a source and a drain of the EPROM transistor means. As used herein, the term "EPROM" refers to a type of transistor which is a floating gate avalanche injection MOS field effect transistor or a metal-nitride-oxide-semiconductor field effect transistor (MNOS). Typically, the current path of the EPROM transistor means or a terminal of the EPROM transistor means is coupled to the input term to receive current from that input term. The MOS field effect transistor (FET) means is coupled to the product term for modulating the binary state of the product term. The MOS field effect transistor means is other than an EPROM field effect transistor; that is, the MOSFET means is typically a standard n-channel MOS field effect transistor without a floating gate and typically has a much lower impedance during operation than an EPROM MOS field effect transistor. The MOS EPROM transistor means is coupled to the MOSFET means to modulate the effect of the EPROM cell on the product term through the MOSFET means (rather than through the traditional MOS EPROM transistor). It has been found that the MOSFET means usually provides more current than a comparable EPROM transistor and consequently, the product term may be more quickly switched using the invention. The MOSFET means includes a current path which is coupled to the product term and which, when appreciable current flows through that current path, causes the product term to be pulled down close to Vss (a reference voltage usually representing a binary state), which is usually ground. Thus, the current path through the product term to Vss does not pass through an MOS EPROM FET.

The invention provides an MOS EPROM cell in an MOS programmable logic array having a plurality of input terms and a plurality of product terms. In one embodiment, the EPROM cell includes an MOS EPROM field effect transistor means for storing binary data having two possible states; that is, a floating gate of the MOS EPROM field effect transistor means can receive charges causing the floating gate to be programmed to correspond to one of the two possible states. The EPROM transistor means has a current path (first current path) formed between and including a source and a drain; that first current path has a one end and an other end. One end of that first current path is coupled to one of the plurality of input terms; that one end may be either the source or the drain of the EPROM FET depending on the type of FET (e.g. P-channel or N-channel). The EPROM cell further includes a MOSFET means which has its own current path (second current path) formed between and including a source and a drain. The current path of the MOSFET means includes a one end and an other end. One end of the current path of the MOSFET means is coupled to one of the plurality of product terms for modulating the binary state of that product term and the other end of the current path of the MOSFET means is coupled to a first reference voltage which corresponds to one binary state (usually binary "0"). The MOSFET means is other than an EPROM FET and includes a gate coupled to the other end of the current path of the EPROM FET such that the EPROM FET controls the current path of the MOSFET means. The MOSFET means modulates the product term to which it is coupled such that, when appreciable current flows in the current path of the MOSFET means, that product term is driven to approximately a reference voltage corresponding to the one binary state (e.g. binary low-ground). The EPROM cell further includes a leakage MOSFET means having a source and a drain which form and include the current path of the leakage MOSFET means. One end of the current path of the leakage MOSFET means is coupled to the gate of the MOSFET means and the other end of the current path of the leakage MOSFET means is coupled to a reference voltage which is the same reference voltage that the MOSFET means is coupled to.

In one particular embodiment of the MOS EPROM PLA cell, the MOS PLA includes a product term, a write product term and an input term. The EPROM cell includes a write MOS EPROM FET means and a read MOS EPROM FET means, along with the MOSFET means which is other than an EPROM FET. The write MOS EPROM FET means has a floating gate for storing binary data and has a current path between a source and a drain and which includes the source and drain of the write EPROM. That current path has a one end and an other end. The one end of that current path is coupled to a reference voltage (first reference voltage—Vss) and the other end of the current path of the write EPROM FET is coupled to the write product term for receiving a super voltage during programming of the EPROM cell and for receiving the first reference voltage during reading of that EPROM cell. The write MOS EPROM FET means includes a gate which is coupled to the input term. The read EPROM FET means includes a gate, a source and a drain and further includes the same floating gate as the write EPROM FET means. That is, the floating gate of the read EPROM FET means is shared between the read EPROM FET means and the write EPROM FET means. The gate of the read EPROM FET means is coupled to receive the super voltage during programming of the EPROM cell and is coupled to receive a second reference voltage during programming of the EPROM cell. The read EPROM FET includes a current path having a one end and an other end, and the one end of that current path is coupled to the input term. The EPROM cell further includes a MOSFET means which is other than an EPROM FET and has a gate coupled to the other end of the current path of the read EPROM FET means such that the read EPROM FET means controls the MOSFET means and specifically the current path of the MOSFET means. The current path of the MOSFET means (third current path) includes the source and drain of the MOSFET means. The current path of the MOSFET means has a one end and an other end. One end of the current path of the MOSFET means is coupled to the product term for modulating the binary state of the product term and the other end of the current path of the MOSFET means is coupled to receive the first reference voltage which corresponds to a first binary state (binary low-ground in this embodiment). The MOSFET means modulates the product term which it conducts appreciable current in the current path of the MOSFET means by driving the product term to a voltage approximating the first reference voltage which corresponds to the first binary state. This EPROM cell further includes a leakage MOSFET means which has a source and a drain which forms and includes the current path of the leakage MOSFET means (fourth current path). One end of that current path is coupled to the first reference voltage and the other end of that current path is coupled to the gate of the MOSFET means. The leakage MOSFET means includes a gate which is coupled to receive a reference voltage which approximates the threshold voltage of the leakage MOSFET means, which reference voltage is applied to the gate of the leakage MOSFET means during reading of the EPROM cell. During programming of that EPROM cell, the gate of the leakage MOSFET means is coupled to receive the first reference voltage which is also coupled to the MOSFET means.

In another embodiment of the invention, the MOS programmable logic array includes a (read) product term, a write product term, a write input term and a read input term. The MOS EPROM PLA cell in this particular PLA includes a write EPROM FET means and a read EPROM FET means, along with the MOSFET means which is other than an EPROM FET. The write MOS EPROM FET means includes a floating gate for storing charges such that the floating gate has two possible states being charged and uncharged. The write EPROM further includes a current path (first current path) which includes a source and a drain of the write EPROM. The current path of the write EPROM includes a one end and an other end, and the one end of that current path is coupled to a first reference voltage and the other end is coupled to the write product term for receiving a super voltage during programming of the EPROM cell and for receiving the first reference voltage during reading of the EPROM cell. The write EPROM FET means has a gate which is coupled to the write input term to receive a second reference voltage (usually power supply reference voltage) during reading of the EPROM cell and is coupled to receive the super voltage during programming of the EPROM cell. The read EPROM FET means includes a gate, a source and a drain and further includes the same floating gate as the write EPROM FET means. That is, the floating gate of the read EPROM FET means is shared with the write EPROM FET means. The gate of the read EPROM FET means is coupled to the gate of the write EPROM FET means. The read EPROM FET means includes a current path which includes the source and drain of the read EPROM. One end of that current path is coupled to the read input term and the other end of that current path is coupled to the gate of the MOSFET means to control the MOSFET means and particularly the current in the current path of the MOSFET means. That is, the MOSFET means has a current path (third current path) a portion of which is formed between and including the source and drain of the MOSFET means. That current path is controlled by the read EPROM FET means. One end of the current path of the MOSFET means is coupled to the product term to modulate the binary state of the product term and the other end of the current path of the MOSFET means is coupled to receive the first reference voltage which corresponds to a first binary state (e.g binary low-ground in this embodiment). The MOSFET means modulates the product term such that when appreciable current flows in the current path of the MOSFET means, the product term is driven to approximately the first reference voltage which corresponds to the first binary state. This EPROM cell may include a leakage resistor means in place of the leakage MOSFET means.

This invention and certain embodiments thereof, will be described with reference to particular circuits, architectural layouts, voltages and signals and other specific details of the invention where necessary for a thorough understanding of the invention. Other well known details which are not necessary to an understanding of the invention will be described in block diagram form in order not to unnecessarily obscure the invention. It will be understood by those skilled in the art that the invention may be practiced without using the specific details disclosed herein. It will also be understood that the figures are for purposes of illustration.

DESCRIPTION OF THE DRAWINGS

FIG. 1A shows a prior art programmable logic array (PLA) with two product terms and four input terms.

FIG. 1B shows another prior art programmable logic array utilizing two EPROMs per EPROM cell and further shows a NOR gate which is characteristically used in PLAs.

FIG. 1C shows a perspective view above an MOS field effect transistor having a gate 37, a source 35 and a drain 36. This figure is used to show the definition as used herein of the aspect ratio of a field effect transistor, which is the width, as shown in FIG. 1C divided by the length, as shown in FIG. 1C.

FIG. 2 shows an embodiment of the present invention using a single EPROM MOS insulated gate field effect transistor for each EPROM cell.

FIG. 3 shows an embodiment of the present invention utilizing two EPROMs per EPROM cell; that is, there are two separate EPROM MOS field effect transistors for independent reading (normal use) and programming (writing).

FIG. 4 shows the presently preferred embodiment of the invention which utilizes two EPROM transistors for each EPROM cell.

FIG. 5 shows an enlarged, commonly used, schematic representation of a PLA chip where the present invention may be used.

FIG. 6 shows a schematic for a circuit for producing a reference voltage referred to as $V_{LK}$ (V leak).

FIG. 7 shows a technique for producing decoded programming voltages ("the super voltages"). FIG. 7 also shows the status of the programming mode signal (PGM signal) in the normal/run mode and in the program mode.

FIG. 8 shows in detail the decoder shown in FIG. 7 for producing the decoded $V_{pp}$ for the various product terms.

FIG. 9 shows another embodiment of an EPROM PLA cell of the present invention.

FIG. 10 shows another embodiment of an EPROM PLA cell of the present invention.

DESCRIPTION OF THE INVENTION

An embodiment of the present invention using one EPROM MOS (metal-oxide-semiconductor) insulated gate field effect transistor (FET) for each EPROM cell is shown in FIG. 2. The programmable logic array shown in FIG. 2 includes two product terms, product term 52 (labelled P.T.1) and product term 53 (labelled P.T.2). Two input terms 54 and 55 are shown along with four EPROM cells. A pull-up MOS field effect device 34 is shown coupled to the product term 52; it will be understood that a pull-up device, such as device 34, will always be coupled to a product term (but not always shown in order to not unnecessarily obscure the invention). The pull-up device, such as pull-up device 34 on product term 52 as shown in FIG. 2, will cause the product term to be pulled up to substantially Vcc (a power supply reference voltage, which is often 5 V) when all of the MOSFET transistor means coupled to that product term, such as 58a and 58b, are off (when no appreciable current flows through these transistors).

Each of the EPROM cells in the PLA of the invention as shown in FIG. 2 contains three MOS field effect transistors, one of which is an MOS EPROM field effect transistor means which is used for storing binary data having two possible states. MOS transistors 56a, 56b, 57a and 57b are the MOS EPROM field effect transistor means shown in FIG. 2. The MOSFETs and MOS EPROM FETs as used in this invention each include three terminals designated gate, source and drain. The source and drain of each MOSFET and EPROM FET forms a current path between the source and drain of the FET and the gate of each FET controls the current of the FET. The current path of each MOSFET and EPROM FET as used in this invention includes two ends which are designated as one end of the current path and an other end of the current path. Each of these EPROM transistor means includes a separately programmable floating gate 9 for storing binary data. Each EPROM cell shown in FIG. 2 includes an MOS field effect transistor means 58a, 58b, 65a and 65b which serves to modulate the binary status of the product terms. For example, the MOSFET means 58a and 58b will modulate the product term 52. Similarly, MOSFET means 65a and 65b will modulate the product term 53 (P.T.2) depending on whether either MOSFET means 65a or 65b will conduct appreciable current thereby pulling the product term 53 down substantially to Vss, which is a reference voltage representing one binary state. Each EPROM cell shown in FIG. 2 also includes a leakage MOSFET, such as leakage MOSFET 59a, 59b, 66a and 66b. As described below, the purpose of the leakage MOSFET, such as 59a, is to sink any current that an "off" (i.e. not conducting appreciable current because either the EPROM is programmed or the gate of the EPROM is binary low) EPROM may have.

As shown in FIG. 2, a specific write product term is bussed parallel with and associated with each product term and is coupled to the gates of each of the EPROM FET means along a particular product term (row). Thus, for example write product term 50 (W.P.T.1) is bussed parallel with and is associated with product term 52 and is coupled to the gates of EPROM FET means 56a and EPROM FET means 56b. The write product term 50 is also coupled to the output of multiplexer 76 which selects between, depending on the status of the program mode signal 69, a decoded $V_{pp}$ for the product term 52 or Vcc. In the embodiment shown in FIG. 2 each product term will have a write product term which is bussed parallel with the product term line to provide the programming voltage during programming to the gate of the EPROM means in each of the EPROM cells along that particular product term. Thus, write product term 51 is bussed along the product term 53 to provide the programming voltage during the programming mode to the gates of the EPROM FET means 57a and 57b. During the normal run mode, the write product terms, such as write product term 50 and 51 provide the Vcc reference voltage to the gates of the EPROM FET means throughout the array.

Each write product term is coupled to the output of a 2 to 1 multiplexer (MUX), which multiplexer is controlled by a select line (SL) which is coupled to the programming mode signal, which shall be referred to as PGM signal 69 which could be provided as a pin on a chip to switch the PLA circuit in the chip between the run mode (reading) and the program mode (programming). Thus, for example as shown in FIG. 2, the multiplexer 76 has a select line which is coupled to the PGM signal 69 which selects between two inputs, the decoded $V_{pp}$ for P.T.1 or Vcc. As used herein, it will be assumed that the PGM signal 69 is high during programming (e.g. binary 1 during programming). The numeral 1 (within the multiplexer 76 and next to an input) indicates that that input labelled "1", which is the Decoded $V_{pp}$ for P.T.1, will be selected when the value of the PGM signal appearing on the select line has the binary value 1. Similarly, the Vcc signal appearing at the "0" input of MUX 76 will be selected when the PGM signal is low (representing the binary value 0). This convention with respect to multiplexers is used throughout this description. The status of the PGM signal during the run mode and the program mode is also shown in FIG. 7 which illustrates how the decoded $V_{pp}$'s are generated, as described below. It will be appreciated that MUXes which have $V_{pp}$ (the super voltage) as an input are well known, prior art analog MUXes. Thus, MUXes 76, 77, 61, 68, 110, 111, 125, 138, 141, 145, 146, 345, 346, 361 and 363 are analog multiplexers.

Also associated with each product term and bussed parallel with each product term is a gate leakage reference voltage signal which is provided to the gates of the leakage MOSFETs, such as MOSFETs 59a and 59b for their product term 52. Similarly, for the product term 53, the gate leakage voltage, $G_{LK2}$ is bussed parallel with the product term 53 and is provided to each of the gates of the leakage MOSFET devices, such as devices 66a and 66b. The particular circuits for providing these gate leakage reference voltages are shown in the inserts within FIG. 2. These circuits involve multiplexers which select between decoded $V_{pp}$'s for the particular product term and a reference voltage signal referred to as $V_{LK}$, which is produced at the output of the circuit shown in FIG. 6. The gate leakage voltage for the leakage MOSFETs associated with product term 53 is provided by a multiplexer 68 which produces the reference voltage $G_{LK2}$. The multiplexer 68, under the control of the PGM signal 69 (which is coupled to the select line 70) selects between a signal 72 which is the decoded $V_{pp}$ for P.T.2 (product term 53) and the reference voltage $V_{LK}$ 74. During the program mode the PGM signal is high thereby selecting the input labelled "1" which is the decoded $V_{pp}$ for the product term 53; during the run mode (reading) the multiplex 68, under the control of the PGM signal 69, will select the reference voltage $V_{LK}$ thereby supplying the $V_{LK}$ reference voltage to the gates of the leakage MOSFETs associated with the product term 53, such as leakage MOSFETs 66a and 66b.

The structure of a particular EPROM cell as shown in FIG. 2 will now be described. It can be seen that the EPROM cells in the array are identical (except for the particular inputs and outputs). The EPROM cell in the upper left corner of the array shown in FIG. 2 includes three MOS field effect transistors, two of which, 58a and 59a are N-channel insulated gate field effect transistor means and 56a is an N-channel MOS EPROM field effect transistor means which includes a floating gate 9 which receives charges thereby permitting the EPROM 56a to store binary data having two possible states (charged and uncharged). The gate of the MOS EPROM FET means 56a is coupled to the write product term 50 to receive either the decoded $V_{pp}$ for P.T.1 or the reference potential Vcc through the multiplexer 76. The MOS EPROM FET means 56a includes a current path formed between and including the source and drain of the EPROM means 56a which current path is coupled to the input term 54 to receive signals applied to the input term 54 during programming or reading of the PLA. One end of the current path of EPROM 56a is coupled to input term 54 and the other end of that current path is coupled to the gate of MOSFET means 58a and to an end of the current path of the leakage MOSFET 59a. In the embodiment shown in FIG. 2, the drain of the MOS EPROM FET means 56a is coupled to the input term 54 while the source of that EPROM means is coupled to the gate of MOSFET means 58a and to the drain of the leakage MOSFET 59a. The FET means 58a has a current path formed between and including its source and drain which, when that current path conducts, couples the product term 52 to the reference potential Vss, which is usually ground. As shown in FIG. 2, the source of MOSFET means 58a is coupled to Vss (sometimes labelled 17) and the drain of MOSFET 58a is the output of the EPROM cell and is coupled to the product term 52. The gate of MOSFET 58a is coupled to an end of the current path of the MOS EPROM means 56a and is also coupled to the drain (an end of the current path) of the leakage MOSFET 59a. The gate of the leakage MOSFET 59a is coupled to the reference voltage $G_{LK}$ 60 which is supplied at the output of MUX 61 under the control of PGM signal 69 which selects between the decoded $V_{pp}$ for P.T.1 (71) or $V_{LK}$ 74.

The operation of an EPROM cell in the embodiment shown in FIG. 2 will now be described. Before programming, all of the floating gates in the array are discharged by the well known manner of exposing the PLA circuit to ultraviolet (UV) radiation which "erases" the floating gates by discharging the electrons which may be stored on any floating gate. The EPROM cell in the upper left corner of the array shown in FIG. 2 is programmed by switching the PGM signal from low to high which causes the MUX 76 to switch the output of the MUX 76 from Vcc to the decoded $V_{pp}$ for P.T.1 (71), thereby making it possible to apply $V_{pp}$ to the gates of the EPROM transistors, such as 56a and 56b. An apparatus for producing the decoded $V_{pp}$ for P.T.1, etc. will be described below in conjunction with FIGS. 7 and 8. At the same time, the MUX 61 will switch its output $G_{LK}$ 60 from $V_{LK}$ to the decoded $V_{pp}$ for P.T.1 (71). It will be appreciated that the decoded $V_{pp}$ for P.T.1 is a signal which is substantially close to Vss (usually ground) in all cases except when the user desires to program an EPROM cell along the row associated with P.T.1 (product term 52). When the user so desires to program an EPROM cell associated with P.T.1, the decoder shown in FIG. 7 and FIG. 8 will supply a voltage substantially close to $V_{pp}$ to the gate of the leakage MOSFET 59a (through MUX 61) and to the gate of the EPROM FET means 56a (through MUX 76); similarly, the gate of the leakage MOSFET 59b will receive substantially $V_{pp}$ as will the gate of the EPROM FET means 56b. The user then selects the particular EPROM cell along the row associated with P.T.1 by selectively applying a super voltage to a particular input term according to well known prior art techniques. The other input terms are usually held close to Vss. Thus, to program the EPROM cell in the upper left portion of FIG. 2, a signal approximating $V_{pp}$ is applied to the input term 54 which causes the programming potential ($V_{pp}$) to appear at the drain of EPROM 56a which will conduct appreciably since the leakage MOSFET 59a will also be on (since its gate is substantially at $V_{pp}$). Thus, significant current will flow through the current path of the EPROM 56a and the leakage MOSFET 59a; that current, together with the super voltage applied to the gate of EPROM 56a, will cause hot electrons to be trapped in the floating gate 9 of the EPROM 56a, thus programming that EPROM transistor. Of course, if the user desires to leave the EPROM unprogrammed, then no super voltage is applied to input term 54 and no significant current will flow through EPROM 56a; hence, the floating gate will not be charged.

After programming the various EPROM cells the user desires to have in the programmed state, the program signal 69 is switched from high to low causing the MUXes 76, 77, 61 and 68 to switch from the "1" input (e.g. decoded $V_{pp}$'s for a particular product term) back to the "0" input of the various MUXes. Thus, for MUXes 76 and 77, the Vcc reference voltage will appear at the output of these multiplexers. Similarly, the $V_{LK}$ 74 reference voltage will appear at the output of the MUXes 61 and 68 during a normal/run mode (reading) of the PLA. After these multiplexers have switched to their normal/run mode, the use of the PLA according to the present invention as shown in FIG. 2 proceeds in a straight forward, conventional manner. Each of the product terms will have a pull-up device, such as MOSFET 34 which will attempt to pull up the product term to the high state (substantially to Vcc); if however any one of the MOSFET means, such as 58a or 58b, coupled to a particular product term conducts appreciable current, then that particular product term will be pulled substantially to Vss (ground).

For purposes of illustration, assume that the EPROM 56a has been programmed (the floating gate 9 of EPROM 56a is charged) while the EPROM 56b remains unprogrammed. The programmed EPROM 56a will not conduct appreciable current regardless of the status of the input term 54. The leakage MOSFET 59 assists in sinking any stray current flowing through the EPROM 56a when the EPROM 56a is programmed and thereby prevents the gate of MOSFET means 58a from charging up to a voltage that turns on MOSFET means 58a. When the input term 54 is low, there will be no appreciable voltage on the gate of the MOSFET means 58a. When the input term 54 is high, the EPROM means 56a (being a substantially large resistance when programmed) will take most of the voltage drop, and the voltage across the source and drain of the leakage MOSFET 59a will be insignificant, causing the voltage applied to the gate of the MOSFET means 58a to be too low to turn on the MOSFET means 58a. As will be described below, the current through the leakage MOSFET means 59a will normally be very low (e.g. 1 microamp) when the EPROM 56a is off. Hence, the programmed EPROM 56a will assure that, regardless of the state of input term 54, the MOSFET means 58a is always off. Since the MOSFET means 58a is always off, it will not be possible for that EPROM cell to pull the product term 52 substantially to Vss (ground in this embodiment). Thus, this EPROM cell cannot affect (modulate) the status of product term 52. However, depending on the status of input term 55, the product term 52 may be pulled to ground since the EPROM 56b is not programmed. Hence, the EPROM cell which contains EPROM 56b can modulate the binary status of the product term 52. If input term 55 is high (e.g. +5 Volts) then the product term 52 will be pulled to ground; if input term 55 is low (e.g. Vss), then the product term 52 will be pulled high (close to Vcc). The voltage applied to the gate of EPROM means 56b will approximate the power supply reference voltage Vcc. Consequently, if a significant potential difference exists between the source and drain of EPROM 56b (caused by a high signal to input term 55), then appreciable current will flow through the current path of EPROM 56b, causing the gate of the MOSFET means 58b to be pulled to a level above the threshold voltage of MOSFET means 58b such that it conducts appreciably. That is, if the input term 55 is pulled high (substantially to Vcc) then the EPROM means 56b will conduct pulling the gate of MOSFET means 58b approximately to Vcc, thereby turning MOSFET means 58b on, which causes the product term to be pulled substantially to Vss (ground). When MOSFET means 58b is on, it will conduct appreciable current thereby "grounding" the product term 52. It can be seen that if the input term 55 is kept low there will be no appreciable current flowing through EPROM 56b and hence the gate of MOSFET means 58b will be substantially low thereby shutting off (no appreciable current) the MOSFET means 58b. When MOSFET means 58b is off in this example, the product term 52 will be pulled to approximately Vcc.

FIG. 6 shows an embodiment of a circuit for producing the reference voltage $V_{LK}$ which is utilized throughout various embodiments of the present invention. This circuit is, of course, not necessary when the leakage MOSFET means is replaced by a leakage resistor means, which replacement is possible in certain embodiments that are described below. This circuit includes three MOSFETs 191, 192 and 193 and a capacitor 190. The MOSFET 193 is an N-channel device having its source coupled to Vss and its drain coupled to the output of the $V_{LK}$ 74 circuit. The gate of MOSFET 193 is coupled to the PGM signal 69 such that when the PLA is in the program mode (PGM signal 69 high), MOSFET 193 will conduct appreciable current thereby pulling the output of the $V_{LK}$ circuit substantially to Vss (ground); this feature is useful for the embodiments shown in FIGS. 3 and 4 and is not used in the embodiment shown in FIG. 2 because the MUXes 61 and 68 will not utilize the reference voltage $V_{LK}$ 74 during the program mode (they are switched to the inputs labelled "1"). The MOSFET 192 is a P-channel transistor having its source coupled to Vcc 75 and its drain coupled to the output of the $V_{LK}$ circuit; the gate of this P-channel device is coupled to Vss so that the MOSFET 192 will be on, but not on strong enough to prevent MOSFET means 193 from pulling the output of $V_{LK}$ substantially to Vss (ground). This may be accomplished by making MOSFET 192 so that is has a high resistance (e.g. its aspect ratio may be on the order of approximately 1/100). MOSFET 191 is shown in FIG. 6 with its gate and drain coupled to the output of the $V_{LK}$ circuit while its source is coupled to Vss. MOSFET 191 should be designed to match the leakage MOSFET used in the particular embodiment of the EPROM cell in this invention. That is, the MOSFET 191 should have the same physical parameters (e.g. gate length, source and drain doping concentration, etc.) and characteristics of the leakage MOSFET used in the EPROM cell of the invention. A typical aspect ratio of MOSFET 191 may be 2/1. The capacitor 190 should be moderately large (greater than about 20 picofareds) so that the output from the $V_{LK}$ circuit will increase in voltage should Vss "bounce" up in voltage, thereby to insure that the leakage MOSFET remains on. The reference voltage at the output of the $V_{LK}$ 74 circuit should approximate the threshold voltage of the leakage MOSFET so that a small current flows through the leakage MOSFET (e.g. approximately 1 microamp through leakage MOSFET 59a) when the EPROM transistor (e.g. EPROM 56a) is off.

The reference voltage provided at the output of the $V_{LK}$ 74 circuit should not be too high because the higher it is, the more likely it may cause the leakage MOSFET, such as leakage MOSFET 59a to conduct significantly to the extent that it pulls down the gate on the MOSFET means 58a substantially to ground when that gate should be high. For example, when the input term 55 is high and the EPROM means 56b is unprogrammed, the EPROM means 56b will be on and will tend to pull the gate of the MOSFET means 58b close to Vcc (where it should be) unless the $V_{LK}$ reference voltage is too high (causing the leakage MOSFET 59b to pull the gate of 58b close to ground). On the other hand, the $V_{LK}$ circuit should not produce a $V_{LK}$ reference voltage that is too low because the leakage MOSFET, such as leakage MOSFET 59b, needs to be able to sink any leakage current that an "off" EPROM means, such as 56b, inherently produces.

An alternative embodiment of the present invention is shown in FIG. 3. The programmable logic array of FIG. 3 may, as with the embodiment of FIG. 2, be incorporated into a PLA chip, such as that shown in FIG. 5 or FIG. 7. The PLA of FIG. 3 includes product terms 105 and 106, shown horizontally, and input terms 101 and 102 which are shown vertically. Associated with each product term is a write product term which is coupled to a multiplexer which selects between Vss ("17") and a decoded $V_{pp}$ signal for the particular product term. Thus, for example, product term 105 is bussed parallel with the write product term 103 which is coupled to the output of the MUX 110. The select line of the MUX 110 is coupled to the PGM signal 69 to cause the MUX 110 to select between the decoded $V_{pp}$ for P.T.1 (71) and Vss (ground in this embodiment). During programming of the PLA shown in FIG. 3, the MUX 110 produces at its output the signal 71 which may be (depending on the addresses provided as described with reference to FIG. 7) a voltage approximating $V_{pp}$ or Vss (ground). When the PLA is in the read mode the MUX 110 selects the signal VSS for outputting to the write product term 103. As noted previously, a pull-up device, such as pull-up device 34 should be coupled to each of the product terms. An alternative pull-up device 34b is shown coupled to product terms 105 and 106; that pull-up device 34b is identical to the pull-up device 34 except that the gate of the pull-up device 34b is coupled to the output of an inverter 34c and the input of that inverter 34c is coupled to the PGM signal. The inverter 34c produces the signal $\overline{PGM}$. This pull-up device 34b is an improved alternative to the pull-up device 34 in that, during programming the product terms will not be pulled high which improves the characteristics of the circuit by not permitting current to flow through the product term or the MOSFET means coupled to the product term, such as MOSFET means 118b. It will again be appreciated that each product term, such as product term 105 is coupled to the input of a NOR or OR gate, such as NOR gate 178 or OR gate 178b.

The PLA shown in FIG. 3 includes four identical EPROM cells, each of which includes four transistors. Each EPROM cell includes two MOS EPROM FET means, such as EPROM FET means 107a and 112a in the upper left cell of FIG. 3. In each EPROM cell, one EPROM FET means is a read EPROM FET and the other is a write EPROM FET. The EPROM FET means 107a is the write EPROM transistor and the EPROM FET means 112a is the read EPROM transistor. Similarly, for the other EPROM cell associated with product term 105, the EPROM FET means 107b is the write transistor and the EPROM FET means 112b is the read EPROM transistor. Each write EPROM FET means (e.g. EPROMS 107a, 107b, 108a, 108b) includes a current path having two ends, one end being coupled to Vss and the other end being coupled to a particular write product term. Each EPROM cell in the PLA of FIG. 3 includes a leakage MOSFET, which is substantially the same as the leakage MOSFET described for the PLA of FIG. 2. However, the leakage MOSFET used in the embodiment shown in FIG. 3 has its gate coupled directly to the output of the $V_{LK}$ circuit (to receive the reference voltage $V_{LK}$) rather than to a multiplexer which selects between that $V_{LK}$ reference voltage and a decoded $V_{pp}$ signal. Thus, the leakage MOSFET transistor means 114a, 114b, 119a and 119b each have a gate which is coupled to the output of the $V_{LK}$ circuit; furthermore, the source of each leakage MOSFET means in this embodiment is coupled to the reference potential Vss and the drain of each leakage MOSFET is coupled to the gate of the MOSFET means, such as transistor 113a, which is used to pull down a product term. Each leakage MOSFET means and each MOSFET means includes a current path having two ends (one end and an other end). In each EPROM cell, the read and write EPROM transistors share a floating gate 33. The write EPROM transistor means in each EPROM cell charges that floating gate 33 in each cell in the manner described above. It will be understood that each EPROM cell has its own, separately programmable floating gate 33. Each of the EPROM cells in the PLA of FIG. 3 includes a MOSFET means which modulates the product term to which it is coupled through the influence of the read EPROM transistor means. The MOSFET means 113a, 113b, 118a and 118b each include a current path which is coupled to the appropriate product term and which, when appreciable current flows through the current path, causes the product term to be pulled down close to the reference voltage Vss, which is usually ground. Thus, the MOSFET means 113a has a current path formed between (and including) the source and drain of that MOSFET means; the drain of the MOSFET means 113a is the output of the EPROM cell in the upper left corner of FIG. 3 and is coupled to the product term 105. The source of MOSFET means 113a is coupled to the reference voltage (potential) Vss.

Each of the read EPROM FET means in the EPROM cells shown in FIG. 3 includes a current path an end of which is coupled to a particular input term; the other end of that current path is coupled to the gate of the MOSFET means which is used to modulate the product term. The EPROM FET means 112a, 112b, 117a and 117b are the read EPROM FET means shown in FIG. 3. The gate of each read EPROM FET means is coupled to the output, labelled $V_R$, of the multiplexer 125 which selects between $Y_{pp}$ and the reference voltage Vcc, under the control of the PGM signal 69 appearing at the select line of that multiplexer. There is no need to decode the $V_{pp}$ signals before applying to the multiplexer 125 because the signal does not participate in the selection of which particular EPROM cell is programmed.

The operation of the PLA in FIG. 3 will not be described. Programming of a particular EPROM cell is performed by selectively applying a super voltage ($V_{pp}$) to a particular input term in the well known manner of the prior art while at the same time applying a voltage approximating the super voltage to the appropriate write product term through the multiplexer associated with that write product term. For example, the EPROM cell in the upper left corner of FIG. 3 is programmed by switching the PGM signal from low to high and presenting a super voltage as the decoded $V_{pp}$ (71) signal at the input labelled "1" of the MUX 110; this causes the super voltage to appear along the write product term 103 which is coupled to the drain of the write EPROM MOS field effect transistor means 107a. At the same time, a super voltage is applied to the input term 101 causing the gate of the EPROM 107a, which is coupled to the input term 101, to be at the super voltage potential. The source of the write EPROM means 107a is coupled to Vss and hence a voltage approximating $V_{pp}$ will appear across the source and drain of EPROM 107a while the gate of EPROM 107a carries the super voltage causing hot electrons from the channel region of EPROM 107a to migrate into the floating gate 33 of EPROM 107a. These hot electrons become trapped in that floating gate 33 which is contiguous with the floating gate of the read EPROM 112a. It will be appreciated that this EPROM cell can be left unprogrammed by not applying the super voltage to the input term 101 or by not applying the super voltage to write product term 103. The read EPROM transistor means 112a will not charge the floating gate 33 even if a super voltage is applied to the input term 101 because the leakage MOSFET 114a will not conduct since the $V_{LK}$ circuit output in the program mode is pulled substantially to ground (Vss) by the MOSFET 193, as shown in FIG. 6.

After the programming of the PLA in FIG. 3 is completed, the PGM signal is switched from high to low causing all write product terms to be taken to the reference voltage (potential) Vss; since the source and drain of all of the write EPROM FET means are at Vss, these write EPROMs in all of the EPROM cells will now be off and have no effect on the operation of the EPROM cells in the array. At the same time, the voltage applied to the gate of the read EPROM FET means in all of the EPROM cells will be Vcc as the MUX 125 will now select the "0" input to the MUX 125 which is the reference voltage Vcc. Also during a normal/run mode, the $V_{LK}$ circuit shown in FIG. 6 supplies the $V_{LK}$ reference voltage to the gates of the leakage MOSFET transistor means, such as leakage MOSFETs 114a and 114b.

In order to describe the normal/run (reading) mode of the PLA shown in FIG. 3, it will be assumed that the read EPROM FET means 112a has been programmed while the read EPROM FET means 112b has been left unprogrammed. The EPROM cell associated with EPROM 112a will be incapable of pulling the product term 105 to ground (Vss) because no appreciable current will flow through the current path of EPROM 112a regardless of the status of the input term 101. When the input term 101 is low the gate of the MOSFET means 113a will also be low thereby turning that MOSFET means 113a off and preventing the EPROM cell from pulling the product term 105 to ground. When the input term 101 is high, the MOS EPROM FET means 112a will act as a large resistor (thereby taking a voltage drop that is substantially equivalent to the "high" voltage level), thereby preventing a significant potential difference between the gate and source of the MOSFET means 113a; that is, the gate of MOSFET means 113a will be at a low voltage potential with respect to its source and hence off. The EPROM cell associated with the read EPROM transistor means 112b is capable of modulating the binary status of the product term 105 as a function of the binary (state) status of the input term 102. The MOS EPROM FET means 112b, being unprogrammed, may conduct appreciable current thereby pulling the gate of the MOSFET means 113b substantially close to Vcc when a signal substantially close to Vcc (e.g. within several MOSFET threshold voltages of Vcc) is applied to the input term 102. However, when the input term 102 is close to Vss, then no appreciable current flows through the EPROM 112b and the gate of MOSFET means 113b is close to Vss and hence off. In this circumstance (both EPROM cells are off) the product term 105 will be pulled high by a pull-up device such as 34b.

FIG. 4 shows the presently preferred embodiment of the invention. Shown in FIG. 4 are four EPROM cells in a programmable logic array having two input terms, input term 135 and input term 136, and having two product terms, product term 151 and product term 153, which are also referred to as read product terms 151 and 153. Associated with and bussed parallel with each read product term is a write product term; for example, write product term 150 is bussed parallel with and is associated with product term 151. Similarly, write product term 152 is bussed parallel with and is associated with product term 153. The write product term provides the super voltage for programming the write EPROM transistor means, such as EPROM 160a, by being coupled to an end of the current path of the write EPROM transistor means, such as EPROM 160a. During the normal/run (reading) mode of the PLA according to FIG. 4, the write product terms provide the reference voltage (potential) Vss, which is typically ground so that the write EPROM transistor means will be off during the normal/run mode of the PLA. The application of the two different signals—$V_{pp}$ or Vss—to the write product term is accomplished by a multiplexer which selects between the decoded $V_{pp}$ for the particular product term and Vss. FIG. 4 shows two such multiplexers 145 and 146. Multiplexer 145 receives two inputs which are labelled "0" and "1" and selects between those two inputs depending on the status of the PGM signal 69 which is coupled to the select line of multiplexer 145. The output of the multiplexer 145 is coupled to write product term 150. During programming, the PGM signal 69 selects the input labelled "1" which may be the super voltage for programming EPROM cells along the product term 151; that is, if the user desires to program a particular EPROM cell along product term 151, then the super voltage is applied to the write product term 150 via the decoding circuitry described below. Multiplexer 146 similarly selects between the decoded $V_{pp}$ signal 72 and Vss and provides one of those signals at the output to the multiplexer 146 which is coupled to the write product term 152.

It can be seen by comparing FIG. 4 to FIG. 3 that the gates of the read and write EPROMs in a particular EPROM cell (e.g. EPROMs 160a and 161a) have been tied together and are coupled to a write input term, such as write input term (W.I.T.) 135b. Coupling these gates makes it easier to produce the PLA using standard MOS planar semiconductor processing technology. It can be seen that each input term of the PLA shown in FIG. 4 is split into two separate terms for reading and for writing (programming). In particular, input term 135, through the multiplexers 137 and 138, are split into a read input term 135a and a write input term 135b. Similarly the input term 136 is split, through the multiplexers 142 and 141 into a read input term 136a and a write input term 136b. Each read input term (RIT) is coupled to a multiplexer, such as multiplexer 137 which selects between Vss and the input term for that particular RIT. It will be appreciated that the input terms 135 and 136 may be coupled to pins on the exterior of the PLA chip, such as pin 179 shown in FIG. 5. The read input term 135a is coupled to the output of the MUX 137 which selects between Vss (the input labelled "1") and input term 135. Similarly, read input term 136a is coupled to the output MUX 142 which selects between Vss (the input labelled "1") and input term 136. Each write input term is coupled to a multiplexer which selects between the input term and the circuit (power) supply reference voltage Vcc. Thus, write input term 135b is coupled to the output of the MUX 138 which has two inputs, one of which is coupled to the input term 135 through line 139 and the other of which is coupled to Vcc. Write input term 136b is coupled to the output of MUX 141 which selects between input term 136 and Vcc, depending on the status of the PGM signal 69 appearing at the select line of MUX 141.

It will be appreciated that each read product term has a pull-up device means, such as MOSFET 34b shown on read product term 153. It will also be appreciated that each product term is coupled to the input of an OR or NOR gate, such as NOR gate 178.

Each EPROM cell in the PLA of FIG. 4 contains four insulated gate field effect transistor means. In particular, each EPROM cell includes a write EPROM MOS field effect transistor means, such as EPROMs 160a, 160b, 165a and 165b. Each EPROM cell also contains a read EPROM MOS field effect transistor means, such as EPROMs 161a, 161b, 166a and 166b. Each EPROM cell also includes a leakage MOSFET means, being substantially similar to the leakage MOSFET means described above with respect to the PLAs of FIGS. 2 and 3; the leakage MOSFET means of the PLA shown in FIG. 4 are leakage MOSFETs 163a, 163b, 168a and 168b. As described below in conjunction with FIG. 9, each of the leakage MOSFET means in the PLA EPROM cells of FIG. 4 may be replaced by a leakage resistor means 247; the leakage resistor means replaces the current path of the leakage MOSFET means and does not require the $V_{LK}$ reference voltage. The output of each EPROM cell (which is coupled to a read product term) is provided by the MOSFET means, such as MOSFET means 162a, or 162b, or 167a or 167b. The MOS field effect transistor means, such as MOSFET means 162a has a current path (formed by the source and drain of that MOSFET) having two ends, an end of which is coupled to a read product term to effect the binary state (status) of that product term. As with the MOSFET means described with respect to the embodiment shown in FIGS. 2 and 3, when appreciable current flows in the current path of the MOSFET means of this embodiment, such as MOSFET means 162a, the particular product term which is coupled to the drain of the MOSFET means is driven to one binary state, Vss. Thus, for example when the MOSFET means 162a conducts appreciable current through the current path of that MOSFET means, the read product term 151 will be driven (pulled down) to substantially Vss. It will be understood that when no appreciable current flows in the current path of the MOSFET means, such as MOSFET 162a, then the EPROM cell will not be able to affect the binary status of the product term coupled to that EPROM cell. Hence, the MOSFET means, such as MOSFET 162a can modulate the binary state of the product term and is other than an EPROM field effect transistor. Each of the EPROM cells in the embodiment shown in FIG. 4 includes an MOS EPROM transistor means (e.g. means 161a) which is coupled to the MOSFET means so as to modulate the effect of the EPROM cell on the product term through the MOSFET means. Thus, the source (a terminal) of the read EPROM transistor means 161a is coupled to the gate of the MOSFET means 162a to modulate or drive the MOSFET means 162a to thereby modulate the effect of the EPROM cell on the product term 151. In the embodiment shown in FIG. 4, each leakage MOSFET means, each MOSFET means, and each EPROM FET means includes a current path having two ends (a one end and an other end), which current path includes (and is formed by) the source and drain of the FET.

The gates of the read and write EPROM FET means in each EPROM cell in FIG. 4 are coupled to a write input term. For example, the gates of the EPROMs 160a and 161a are coupled to their write input term 135b. In each EPROM cell in the embodiment shown in FIG. 4, the read and write EPROM FET means share a contiguous floating gate 155 on which charges may be stored. Thus, for example, EPROMs 160a and 161a share a floating gate 155 for storing binary data having two possible states (charged and uncharged). It will be understood that each EPROM cell in the invention of FIG. 4 has its own, separately programmable floating gate 155 (and hence it is not connected or coupled to the floating gate 155 of any other EPROM cell). The read EPROM FET means in an EPROM cell of FIG. 4 has a current path formed between (and including) a source and a drain of that EPROM means; an end of that current path is coupled to a read input term. The other end of that current path is coupled to the gate of the MOSFET means and to an end of the current path of the leakage MOSFET in each EPROM cell. Hence, it can be seen from FIG. 4 that one end of the current path of the EPROM 161a is coupled to the read input term 135a, and the other end of that current path is coupled to the gate of the MOSFET means 162a (which is used to directly drive the output of the EPROM cell connected to the product term 151) and to one end of the current path of the leakage MOSFET 163a. In the specific embodiment of the PLA shown in FIG. 4, the drain (a terminal) of the read EPROM MOS field effect transistor means 161a is coupled to read input term 135a and the source of EPROM 161a is coupled to the drain of leakage MOSFET 163a and to the gate of MOSFET means 162a. The gate of the leakage MOSFET means 163a is coupled to the referene voltage $V_{LK}$ (74), which is a reference voltage produced at the output of the circuit shown in FIG. 6 as described above. In each EPROM cell, the source of the leakage MOSFET means (e.g. 163a) and the source of the MOSFET means (e.g. 162a) are coupled to Vss.

The operation of an EPROM cell according to the present invention as shown in FIG. 4 will be described with reference to the EPROM cell in the upper left corner of FIG. 4. It will be understood that the structure and operation of the other EPROM cells in FIG. 4 will be substantially the same as the structure and operation of the EPROM cell in the upper left corner of FIG. 4. Prior to programming, the entire PLA is exposed to UV to erase all floating gates. Then the user decides which EPROM cells to program and which to leave unprogrammed. To program an EPROM cell, the user switches the PGM signal 69 from low to high thereby causing the multiplexers connected to the write product terms to switch from the "0" input to the "1" input. Thus, the multiplexer 145 provides the signal decoded $V_{pp}$ (71) which may be either Vss (to not program) or substantially $V_{pp}$ (to program) depending on whether the user desires to program an EPROM cell coupled to the product term 151. Applying the signal $V_{pp}$ to the write product term 150 causes a significant voltage drop across the source and drain of the write EPROM transistors, such as 160a and 160b. These write EPROM transistors will conduct if the programming voltage (super voltage) is applied to the write input term which is coupled to the gates of the read and write EPROMs in the EPROM cell. During programming the read input term 135a is coupled to the reference voltage Vss through the MUX 137. The write input term 135b during programming is coupled to the input term 135 through the line 139 and the MUX 138. Thus, by applying a voltage approximating $V_{pp}$ to the input term 135 during programming, that voltage will appear at the gates of the EPROMs 160a (the write EPROM) and 161a (the read EPROM FET means). When the user desires to program an EPROM cell along the product term 151, the decoded $V_{pp}$ signal 71 supplies a voltage approximating $V_{pp}$ to the write product term 150 which causes the write EPROM 160a to conduct significant thereby causing the floating gate 155 to be charged and hence programming the EPROM cell containing write EPROM 160a. If that EPROM cell is to be unprogrammed, then the input term 135 is taken to Vss and the gates of the read and write EPROMs 160a and 161a will go to a voltage substantially close to Vss and not permit current flow through either the read or write EPROMs 160a and 161a. Thus, when no super voltage is applied to the input term 135 during programming or to the write product term 150, the floating gate 155 will not be charged and hence the EPROM cell in the upper left corner of FIG. 4 will not be programmed. In the embodiment of the PLA shown in FIG. 4, the pull-up device 34b will be substantially off during programming and hence the read product term 151 will float and no significant current will flow through MOSFET means 162a. As noted previously, the reference voltage $V_{LK}$ during programming will be substantially close to ground and thus no current will flow through the leakage MOSFETs, such as leakage MOSFET 163a, during programming.

After programming the various EPROM cells, the user changes the PGM signal 69 from high to low causing the various MUXes to switch from the input "1" to the input "0". Hence, the read input term 135a will be coupled to the input term 135, while the write input term 135b will be disconnected from input term 135 and will be coupled to Vcc. The write product term 150 will be coupled to Vss, thereby turning the write EPROM 160a off. As with the embodiments described previously, if the EPROM cell in the upper left corner of FIG. 4 is programmed, no appreciable current will flow through read EPROM 161a regardless of the binary status of the input term 135. The leakage MOSFET means 163a will assure that, even with the input term 135 high, any stray current through the programmed EPROM 161a will be sunken through the leakage MOSFET means 163a thereby keeping the gate of MOSFET means 162a close to Vss and therefore keeping MOSFET means 162a off. Of course, with MOSFET means 162a off, the EPROM cell will not affect the binary status of the read product term 151. If the EPROM cell is left unprogrammed, then it is possible for the EPROM 161a to conduct appreciable current and thereby pull up the gate of the MOSFET means 162a to a voltage approximating Vcc which causes the MOSFET means 162a to conduct appreciable current and thereby pull down the read product term 151 to a voltage approximating Vss. This will occur when a high signal is applied to the input term 135 and when the EPROM 161a is not programmed. If the input term 135 is kept close to ground, no appreciable current will flow though the unprogrammed EPROM 161a and hence the MOSFET means 162a will be off.

FIG. 9 shows another embodiment of the present invention in which the current path through (from) the product term to Vss does not pass through an MOS EPROM FET. FIG. 9 shows an EPROM PLA cell of the type described in conjunction with FIG. 4; specifically, each product term (read product term) is associated with and bussed parallel with a write product term and each input term is "split" into a read input term (RIT) and a write input term (WIT). Moreover, the multiplexers for the RIT and WIT and write product terms of FIG. 4 will be utilized for the embodiment of the PLA of FIG. 9. It will be understood that the PLA of FIG. 9 may include other identical EPROM cells such as that shown in FIG. 9. The structure and operation of the EPROM cell according to FIG. 9 is identical to the structure and operation of the EPROM cell shown and described with reference to FIG. 4, except that in each EPROM cell of FIG. 9 a leakage resistor means 247 has replaced the leakage MOSFET means. Thus, the EPROM FET 246 is the write EPROM FET (e.g. EPROM 160a), and the EPROM FET 245 is the read EPROM FET (e.g. EPROM 161a); the MOSFET means 244 is the same as the MOSFET means of FIG. 4 (e.g. MOSFET means 162a). The leakage resistor means has a current path having two ends, an end being coupled to Vss and another end being coupled to the gate of the MOSFET means 244. The leakage resistor means 247 serves to leak any current that a programmed read EPROM FET may inherently have and thereby prevent the gate of MOSFET means 244 from charging to a voltage level which may turn on the MOSFET means 244. The leakage resistor means is normally a high impedance resistor having a resistance of approximately 1 to 10 kilo ohms.

Another embodiment of the EPROM PLA cell of the invention is shown in FIG. 10. FIG. 10 shows a PLA having three cells. The PLA also includes a plurality of product terms and a plurality of input terms. Product terms 351 and 353 are shown along with input term 355 and input term 356. Input 355 is coupled during reading of the PLA to the read input term 355b and to the inverted read input term 355a through the multiplexer 360. The inverted read input term 355a is obtained from the read input term 355b by the inverter 370. The multiplexer 360 may be any one of a conventional multiplexing means or other means for providing alternative signals. It will be understood that the multiplexers described herein may be implemented in various ways to provide for alternative signals. That is, the multiplexers described herein may be any means for providing alternative signals. The input term 355 is coupled to the write input term 355c during programming of the PLA shown in FIG. 10 via the multiplexer 361. Similarly, the input term 356 is coupled to the read input term 356b and the inverted read input term 356a during reading of the PLA via the MUX 362. The inverted read input term 356a is obtained from the read input term 356b by inverting through the inverter 371 the read input term signal. During programming of the PLA, the input term 356 is coupled to the write input term 356c through the MUX 363.

Each write product term, such as write product terms 352 and 354 are coupled to the output of a multiplexer which selects between the decoded $V_{pp}$ for the particular product term and the Vss reference voltage. Each of the multiplexers shown in FIG. 10 is controlled by the select line of the multiplexer which is coupled to the program signal 69 (PGM signal).

Each EPROM cell of the PLA shown in FIG. 10 includes a write EPROM FET means, a MOSFET means for modulating the product term, a leakage resistor means, a pull-up read EPROM FET means (pull-up read EPROM) and a pull down read EPROM FET means. In each cell, the write EPROM FET means and the two read EPROM FET means (pull-up and pull down read EPROM FET means) share a common floating gate, such as floating gate 385. Each product term includes a pull-up device, such as pull-up device 34b which is coupled to the product term as shown in FIG. 10. It can be seen that each EPROM PLA cell is identical except for the inputs and outputs of each cell. The write EPROM FET means, such as write EPROM 380a, 380b or 380c, includes a gate which is coupled to the write input term for that particular cell. For example, the gate of the write EPROM 380a is coupled to the write input term 355c. The source of each write EPROM, such as EPROM 380a is coupled to the reference voltage Vss, and the drain of each write EPROM is coupled to a particular write product term. For example, the drain of the EPROM 380a is coupled to the write product term 352. The gate of each pull-up read EPROM, such as pull-up read EPROM 383a, is coupled to an inverted read input term. For example, the gate of the pull-up read EPROM 383a is coupled to the inverted read input term 355a. In each EPROM cell, the current path of the pull-up read EPROM FET is coupled in series with the current path of the pull down read EPROM FET. Thus, it can be seen that the current path (which includes the source and drain) of the pull-up read EPROM 383a is coupled in series with the current path of the pull down read EPROM 384a. The gate of each pull-down read EPROM FET means, such as EPROM 384a, is coupled to a read input term. For example, the gate of the pull down EPROM FET means 384a is coupled to the read input term 355b. In each EPROM cell, the current path of the leakage resistor means, such as leakage resistor means 382a, is coupled between the reference voltage Vss and the gate of the MOSFET means in each EPROM PLA cell. The MOSFET means are shown as MOSFETs 381a, 381b and 381c. Thus, it can be seen that the current path of the leakage resistor means 382a is coupled between the gate of the MOSFET means 381a and the reference voltage Vss.

The operation of an EPROM cell according to the embodiment shown in FIG. 10 will now be described. During programming, the PGM signal 69 causes all the multiplexers shown in FIG. 10 to switch to the input labelled "1". Hence, the read input terms, such as read input term 355b, will be driven to the reference voltage Vss while the inverted read input terms, such as inverted read input term 355a, will be driven to the high binary logical state (it being assumed that Vss is logical low). The write input terms will be either low or at $V_{pp}$ depending on whether an EPROM cell along with the column associated with the write input term is to be programmed. To program the EPROM cell in the upper left corner of FIG. 10, the super voltage ($V_{pp}$) is applied to the write input term 355c through the input term 355 and the MUX 361. At the same time, the decoded $V_{pp}$ for P.T.1 provides the super voltage along the write product term 352. This causes the write EPROM 380a to conduct appreciably causing hot electrons to be trapped in the floating gate 385 in that EPROM cell. Following programming, the PGM signal 69 is switched from high to low causing each multiplexer to provide a current path from the input labelled "0" of each MUX to the output of each multiplexer.

During the reading of the PLA shown in FIG. 10, the write input term is held at the reference voltage Vss, and the write product term is also held at Vss. For purposes of illustration, it will be assumed that the EPROM cell containing MOSFET means 381a is programmed while the EPROM cell containing MOSFET means 381b is not programmed. The EPROM cell containing MOSFET means 381a will keep the gate of the MOSFET means 381a substantially close to Vss thereby keeping the MOSFET means from conducting appreciable current. This is true regardless of the status of the input term 355. Hence, the EPROM cell in the upper left corner of FIG. 10 can not modulate the product term since it is programmed. The other EPROM cell along the product term can, however, pull down the product term 351 and thereby modulate the binary status of the product term 351. If the input term 356 is high, then the read input term 356b will be high while the inverted read input term 356a is low. Since both read EPROM FET means 383b and 384b are not programmed, the pull down read EPROM means 384b will pull down the gate of the MOSFET means 381b to a voltage substantially close to Vss such that the MOSFET means 381b does not conduct appreciable current. In such case, the product term 351 will remain high, particularly since it is assisted by the pull-up device 34b. If on the other hand, the input term 356 is low, the pull down EPROM 384b will be off and the pull-up read EPROM 383b will be "on" causing the gate of the MOSFET means 381b to be substantially close to Vcc thereby turning on the MOSFET means 381b. When the MOSFET means 381b is on (conducting appreciable current) the product term 351 is pulled substantially close to Vss, which corresponds to the low binary state in this embodiment.

An example of decoding circuitry which may be used to provide the decoded $V_{pp}$ for the various product terms will now be described with reference to FIGS. 7 and 8. Various schemes for providing decoded super voltages ($V_{pp}$) are well known in the art and may be utilized with the present invention. The decoder shown in FIGS. 7 and 8 is only one possible implementation and it will be understood that other types of decoders used in prior art PLAs may be used herein to provide the decoded $V_{pp}$'s for the various product terms.

FIG. 7 shows a portion of a PLA chip having three pins 200, 201 and $V_{pp}$ on the exterior of the chip. Also shown in FIG. 7 are several product terms with their associated write product terms and several input terms; also shown as the upper left corner EPROM cell in FIG. 7 is a representative EPROM cell of the type described in conjunction with FIG. 2. Pin 200 is coupled to a multiplexer 202 which is a 2 to 1 MUX that is controlled by a select line which is coupled to the PGM signal 69. The "0" input to the MUX 202 is coupled to the output of a NOR gate 178, and the "1" input to MUX 202 is coupled to the decoder 206 through line 204. Pin 201 is coupled to the MUX 203 which is also a 2 to 1 multiplexer which is controlled by its select line which is coupled to PGM signal 69. The "0" input of MUX 203 is coupled to the output of another NOR gate 178 and the "1" input of MUX 203 is coupled to decoder 206 through line 205. The lines 204 and 205 act as select lines for the decoder 206 which provide the row addresses so the user may select a particular product term ("row") for programming by applying the appropriate binary signals to the pins 201 and 200 during programming. The pins 200 and 201 are multiplexed between providing outputs from the array and providing address signals to permit the user to select particular product terms (i.e. particular rows) for programming. During the normal/run (reading) mode the pins 200 and 201 serve as outputs from the array; during the program mode the pins 200 and 201 provide the address signals to the decoder 206 via the select lines 204 and 205. Following the convention adopted above, each MUX will couple the pin to which it is connected to the "1" input when the PGM signal is high and each MUX during the run mode will connect the pin to which it is connected to the "0" input of that particular MUX.

The decoder 206 shown in FIG. 7 receives the select lines 204 and 205 which provide the row addressing signals. The decoder 206 is also connected to Vss and to $V_{pp}$ and provides four outputs which would be sufficient to provide decoded $V_{pp}$'s for four product terms. It will be appreciated that a select line, such as select line 204 can provide for decoded $V_{pp}$'s for two product terms.

FIG. 8 shows the decoder 206 in greater detail. Decoder 206 includes a demultiplexer 210 (DMUX) and four output circuits, one for each of the decoded $V_{pp}$'s for the four product terms. The reference voltage Vss is the input 211 to the DMUX 210 which provides four outputs 221, 222, 223 and 224. The DMUX 210 is a conventional, well known circuit whch couples one of the four outputs of the DMUX 210 to the input 211 thereby causing one of the four outputs to be at Vss while the other three outputs are close to the circuit supply voltage Vcc. When one of the outputs of DMUX 210 is taken to Vss, the associated output circuit which is coupled to that output provides a voltage approximating $V_{pp}$ through a pass gate, such as pass gate 226a. For example, when output 221 is at Vss, which is typically ground, the pass gate 226a provides a voltage approximating $V_{pp}$ at an output of the decoder 206 thereby providing the decoded $V_{pp}$ for P.T.1 (71). It can be seen that the four output circuits are identical. Each includes a pass gate; the pass gates are MOSFETs 226a, 226b, 226c and 226d. Each pass gate in the output circuits is controlled by the MOS device that has its gate coupled to the output of DMUX 210. For example, the N-channel MOSFET device 225a, having its gate coupled to output 221 of DMUX 210, will turn the pass gate 226a on or off depending on whether the output 221 is at Vss (grounded). If the output 221 is grounded, then device 225a will be substantially off and hence provide a large voltage drop across the source and drain of device 225a causing the gate of 226a to be pulled high thereby turning on the pass gate 226a which then provides substantially $V_{pp}$ (the super voltage) as the decoded $V_{pp}$ for P.T.1 (71). When the output 221 is high, the device 225a will conduct causing the gate of 226a to be pulled close to Vss thereby turning device 226a off. In that state, the decoded $V_{pp}$ for P.T.1 (71) will not provide a voltage sufficient for programming and hence EPROM cells along product term 1 will not be programmed.

Each output circuit shown in FIG. 8 is made up of two depletion MOSFETs and three N-channel MOSFETs. Each of the output circuits is identical and hence only one will be described in detail. The output circuit coupled to output 222 of DMUX 210 has two N-channel MOSFET depletion devices 227b and 229b. Both of these depletion devices should provide, during normal operation, a weak current to thereby permit device 225b to control the gate of the pass gate 226b. Depletion device 227b has an aspect ratio of approximately 2/1 while depletion device 229b has an aspect ratio of approximately 1/5. Device 228b assures that a current will flow when the output circuit is initially turned on since device 228b will always conduct. The gate and drain of device 228b is coupled to circuit supply voltage Vcc and the source of device 228b is coupled to the source of device 227b and the drain of device 229b. The drain of device 227b is coupled to $V_{pp}$ (the super voltage) and the source of device 229b is coupled to the gate of device 226b and to the drain of device 225b. The gates of devices 227b and 229b are coupled together and to the gate of device 226b. The source of device 225b is coupled to Vss and the gate of 225b is coupled to the output 222 of DMUX 210. Device 225b controls the gate of 226b and provides a strong current when on so that it can pull down the gate of 226b close to Vss thereby turning device 226b off. When device 226b is off, (when the gate of 225b is high) the super voltage is not applied to the output of that particular output circuit and hence the decoded $V_{pp}$ for P.T.2 (72) will not provide the super voltage. When device 226b is on (when the gate of 225b is close to Vss) then the output of this circuit will provide the super voltage through line 72. The user selects a particular row in the well known manner by providing signals representing a row address to the select lines 204 and 205; as shown in FIG. 8, the "address" for product term 2 (P.T.2) is "01". For example, to select P.T.2 for programming, the user provides an "0" on line 204 and a "1" on line 205.

Modifications and adaptations of this present invention may be made by those skilled in the art without departing the spirit and scope of the present invention, as defined by the following claims.

We claim:

1. An MOS EPROM cell in an MOS programmable logic array having an input term and a product term, said MOS EPROM cell comprising:

an MOS EPROM transistor means having a floating gate for storing binary data and having a terminal being coupled to said input term, said terminal being one end of a series current path formed by the source and drain of said MOS EPROM transistor means;

an MOS field effect transistor (FET) means being coupled to said product term for controlling the binary state of said product term, said MOSFET means having a control gate and being other than an EPROM field effect transistor, said series current path of said MOS EPROM transistor means being coupled to said control gate of said MOSFET means to control the effect of said EPROM cell on said product term through said MOSFET means, whereby the control of the binary state of said product term by said EPROM cell occurs through said MOSFET means.

2. An MOS (metal-oxide-semiconductor) EPROM cell in an MOS programmable logic array having a plurality of input terms and a plurality of product terms, said MOS EPROM cell comprising:

an MOS EPROM field effect transistor means for storing binary data having two possible states, said MOS EPROM transistor means having a floating gate to receive charges causing said floating gate to be charged to correspond to one of said two possible states, said MOS EPROM field effect transistor means having a first current path including a source and a drain, said first current path being coupled to one of said plurality of input terms;

an MOS field effect transistor (FET) means having a control gate and having a second current path being coupled to one of said plurality of product terms to affect the binary state of said one of said plurality of product terms such that when appreciable current flows in said second current path, said one of said plurality of product terms is driven to one binary state and when no appreciable current flows in said second path, said one of said plurality of product terms is not affected by said EPROM cell, said MOSFET means being other than an EPROM field effect transistor, said first current path of said MOS EPROM FET means being coupled to said control gate of said MOSFET means to control the effect of said EPROM cell on said one of said plurality of product terms, whereby the current path through said one of said plurality of product terms and said second current path in sensing the state of said EPROM cell is not through an EPROM FET.

3. An MOS (metal-oxide-semiconductor) EPROM cell in an MOS programmable logic array having a plurality of input terms and a plurality of product terms, said MOS EPROM cell comprising:

an MOS EPROM field effect transistor means for storing binary data having two possible states, said MOS EPROM transistor means having a floating gate to receive charges causing said floating gate to be charged to correspond to one of said two possible states, said MOS EPROM field effect transistor means having a first current path including a source and a drain, said first current path being coupled to one of said plurality of input terms;

an MOS field effect transistor (FET) means having a second current path being coupled to one of said plurality of product terms to affect the binary state of said one of said plurality of product terms that when appreciable current flows in said second current path, said one of said plurality of product terms is driven to one binary state and when no appreciable current flows in said second path, said one of said plurality of product terms is not affected by said EPROM cell, said MOSFET means being other than an EPROM field effect transistor, said MOS EPROM FET means being coupled to said MOSFET means to control the effect of said EPROM cell on said one of said plurality of product terms;

a leakage MOSFET means having a source and a drain, said source and said drain forming a third current path having a one end and an other end, said one end of said third current path being coupled to said first current path and said other end of said third current path being coupled to a first reference voltage.

4. An MOS EPROM cell as in claim 3, wherein said MOS programmable logic array further comprises a plurality of write product terms, each of said plurality of write product terms being associated with a particular one of said plurality of product terms, and wherein said MOS EPROM FET means further includes a gate being coupled to one of said plurality of write product terms, said one of said plurality of write product terms providing a programming voltage during programming of said MOS EPROM cell and providing a second reference voltage during the reading of said EPROM cell.

5. An MOS EPROM cell as in Claim 4, wherein said leakage MOSFET means further includes a gate being coupled to a third reference voltage, said third reference voltage during the normal use of said EPROM cell being approximately equal to the threshold voltage of said leakage MOSFET and said third reference voltage during programming of said MOS EPROM cell being approximately equal to said a programming voltage.

6. An MOS EPROM cell as in Claim 5, wherein said first reference voltage is ground and said second reference voltage is a power supply voltage and wherein when said floating gate is charged, said one of said plurality of product terms is not affected by said EPROM cell.

7. An MOS EPROM cell in an MOS programmable logic array having a plurality of input terms and a plurality of product terms, said MOS EPROM cell comprising:

an MOS EPROM field effect transistor means for storing binary data having two possible states, said MOS EPROM transistor means having a floating gate to receive charges causing said floating gate to be programmed to correspond to one of said two possible states, said MOS EPROM transistor means having a first current path formed between a source and a drain, said first current path having a one end and an other end, said one end of said first current path being coupled to one of said plurality of input terms;

an MOS field effect transistor (FET) means having a second current path formed between a source and a drain, one end of said second current path being coupled to one of said plurality of product terms for controlling the binary state of said one of said plurality of product terms and the other end of said second current path being coupled to a first reference voltage corresponding to one binary state, said MOSFET means being other than an EPROM field effect transistor and having a gate coupled to the other end of said first current path, said MOSFET means controlling said one of said plurality of product terms such that, when appreciable current flows in said second current path, said one of said plurality of product terms is driven to approximately said first reference voltage corresponding to said one binary state;

a leakage MOSFET means having a source and a drain, said source and said drain forming a third current path having a one end and an other end, said one end of said third current path being coupled to said gate of said MOSFET means and said other end of said third current path being coupled to said first reference voltage.

8. An MOS EPROM cell as in Claim 7, wherein said leakage MOSFET further includes a gate being coupled to a third reference voltage being approximately equal during the normal use of said EPROM cell to the threshold voltage of said leakage MOSFET.

9. An MOS EPROM cell as in Claim 8, wherein said third reference voltage is approximately equal to said first reference voltage during programming of said MOS EPROM cell.

10. An MOS EPROM cell as in Claim 7, wherein said MOS programmable logic array further comprises a pull-up device means coupled to said one of said plurality of product terms.

11. An MOS EPROM cell in an MOS programmable logic array having a product term, a write product term and an input term, said MOS EPROM cell comprising:
a write MOS EPROM FET means having a floating gate for storing binary data and having a first current path between a source and a drain, said first current path having a one end and an other end, said one end of said first current path being coupled to a first reference voltage and the other end of said first current path being coupled to said write product term for receiving a programming voltage during programming of said EPROM cell and for receiving said first reference voltage during reading of said EPROM cell, said write MOS EPROM FET means having a gate being coupled to said input term;
a read MOS EPROM FET means having a gate, a source and a drain and further including said floating gate, said floating gate being shared between said read MOS EPROM FET means and said write MOS EPROM FET means, said gate being coupled to receive said a programming voltage during programming of said EPROM cell and to receive a second reference voltage during reading of said EPROM cell, said read MOS EPROM FET means having a second current path having a one end and an other end, said one end of said second current path being coupled to said input term;
a MOSFET means being other than an EPROM field effect transistor and having a gate coupled to said other end of said second current path such that said read MOS EPROM FET means controls said MOSFET means, said MOSFET means having a third current path between a source and a drain of said MOSFET means, said third current path having a one end and an other end, said one end of said third current path being coupled to said product term for controlling the binary state of said product term and the other end of said third current path being coupled to receive said first reference voltage corresponding to a first binary state, said MOSFET means controlling said product term such that, when appreciable current flows in said third current path, said product term is driven to approximately said first reference voltage corresponding to said first binary state.

12. An MOS EPROM cell as in Claim 11, further comprising a leakage MOSFET means having a source and a drain forming a fourth current path having a one end and an other end, said one end of said fourth current path being coupled to said first reference voltage and said other end of said fourth current path being coupled to said gate of said MOSFET means, said leakage MOSFET means having a gate being coupled to receive a third reference voltage during reading of said EPROM cell and being coupled to receive said first reference voltage during programming of said EPROM cell, said third reference voltage being approximately equal to the threshold voltage of said leakage MOSFET means.

13. An MOS EPROM cell in an MOS programmable logic array having a product term, a write product term, a write input term and a read input term, said MOS EPROM cell comprising:
a write MOS EPROM FET means having a floating gate for storing charges and having two possible states being charged and unchanged and having a first current path including a source and a drain of said write MOS EPROM FET, said first current path having a one end and an other end, said one end of said first current path being coupled to a first reference voltage and the other end being coupled to said write product term for receiving a programming voltage during programming of said EPROM cell and for receiving said first reference voltage during reading of said EPROM cell, said write MOS EPROM FET means having a gate being coupled to said write input term to receive a second reference voltage during reading of said EPROM cell and to receive said a programming voltage during programming of said EPROM cell;
a read MOS EPROM FET means having a gate, a source, and a drain and having said floating gate, said floating gate being shared between said read MOS EPROM FET means and said write MOS EPROM FET means, said gate of said read MOS EPROM FET means being coupled to said gate of said write MOS EPROM FET means, said read MOS EPROM FET means having a second current path including said source and said drain of said second current path, said second current path having a one end and an other end, said one end of said second current path being coupled to said read input term;
a MOSFET means being other than an EPROM FET and having a gate coupled to said other end of said second current path such that said read MOS EPROM FET means controls said MOSFET means, said MOSFET means having a third current path including a source and a drain of said MOSFET means, said third current path having a one end and an other end, said one end of said third current path being coupled to said product term to control the binary state of said product term and the other end of said third current path being coupled to receive said first reference voltage corresponding to a first binary state, said MOSFET means controlling said product term such that, when appreciable current flows in said third current path, said product term is driven to approximately said first reference voltage which corresponds to said first binary state.

14. An MOS EPROM cell as in Claim 13 wherein when said floating gate is in the charged state, no appreciable current can flow in said third current path thereby preventing said MOSFET means from controlling said product term.

15. An MOS EPROM cell as in Claim 13 further comprising a leakage MOSFET means having a fourth current path which includes a source and a drain of said leakage MOSFET means, said fourth current path having a one end and an other end, said one end of said fourth current path being coupled to said gate of said MOSFET means and said other end of said fourth current path being coupled to said first reference voltage, said leakage MOSFET means having a gate being coupled to receive a third reference voltage during reading of said EPROM cell and said first reference voltage during programming of said EPROM cell, said third reference voltage being approximately equal to the threshold voltage of said leakage MOSFET means.

16. An MOS EPROM cell as in Claim 13 further comprising a leakage resistor means having a fourth current path which has a one end and an other end, said one end of said fourth current path being coupled to receive said first reference voltage and said other end of said fourth current path being coupled to said gate of said MOSFET means.

17. An MOS (metal-oxide-semiconductor) EPROM cell in an MOS programmable logic array having a plurality of input terms and a plurality of product terms, said MOS EPROM cell comprising:
- an MOS EPROM field effect transistor means for storing binary data having two possible states, said MOS EPROM transistor means having a floating gate to receive charges causing said floating gate to be charged to correspond to one of said two possible states, said MOS EPROM field effect transistor means having a first current path including a source and a drain, said first current path being coupled to one of said plurality of input terms;
- an MOS field effect transistor (FET) means having a second current path being coupled to one of said plurality of product terms to affect the binary state of said one of said plurality of product terms such that when appreciable current flows in said second current path, said one of said plurality of product terms is driven to one binary state and when no appreciable current flows in said second path, said one of said plurality of product terms is not affected by said EPROM cell, said MOSFET means being other than an EPROM field effect transistor, said MOS EPROM FET means being coupled to said MOSFET means to control the effect of said EPROM cell on said one of said plurality of product terms; and
- a leakage resistor means having a third current path having a one end and an other end, said one end of said third current path being coupled to said first current path and said other end of said third current path being coupled to a first reference voltage.

* * * * *